United States Patent
Sheppard

(10) Patent No.: US 7,092,279 B1
(45) Date of Patent: Aug. 15, 2006

(54) SHARED BIT LINE MEMORY DEVICE AND METHOD

(76) Inventor: Douglas P. Sheppard, 2204 Shadow Creek, Southlake, TX (US) 76092

( * ) Notice: Subject to any disclaimer, the term of this patent is extended or adjusted under 35 U.S.C. 154(b) by 33 days.

(21) Appl. No.: 10/954,047

(22) Filed: Sep. 29, 2004

Related U.S. Application Data

(63) Continuation-in-part of application No. 10/395,312, filed on Mar. 24, 2003, now abandoned.

(51) Int. Cl.
*G11C 11/00* (2006.01)

(52) U.S. Cl. .................. 365/154; 365/63; 365/230.03; 365/230.05

(58) Field of Classification Search ............... 365/154, 365/230.03, 230.05, 63
See application file for complete search history.

(56) References Cited

U.S. PATENT DOCUMENTS

| | | | |
|---|---|---|---|
| 5,276,650 A * | 1/1994 | Kubota | 365/207 |
| 6,243,285 B1 * | 6/2001 | Kurth et al. | 365/149 |
| 6,707,708 B1 * | 3/2004 | Alvandpour et al. | 365/154 |
| 6,711,051 B1 * | 3/2004 | Poplevine et al. | 365/154 |
| 6,711,067 B1 * | 3/2004 | Kablanian | 365/189.02 |
| 6,741,492 B1 * | 5/2004 | Nii | 365/154 |
| 6,781,867 B1 * | 8/2004 | Kurth et al. | 365/149 |

* cited by examiner

*Primary Examiner*—Hoai V. Ho
(74) *Attorney, Agent, or Firm*—Dain Brown Law Office; Daniel R. Brown

(57) ABSTRACT

A memory array employing shared bit-lines. A memory is formed from an array of plural bit-cells organized as plural columns and plural rows. Plural word-lines are aligned with each for the rows, and each is electrically coupled to a discrete fraction of the bit-cells its corresponding row. The memory also includes plural bit-lines that are aligned with the plural columns. Every bit-line is electrically coupled to all of the bit-cells that lie along at least one column. In addition, at least a first one of the bit-lines is further electrically coupled to all of the bit-cells in an additional column. That bit-line is coupled such that every one of the plural bit-cells, that lie along any given row that are coupled to it, is coupled to a unique word-line from the other bit-cells coupled thereto. The shared bit-line invention is applicable to single and multiple port memory arrays. It is applicable to all memory array technologies including, but not limited to, SRAMs and DRAMs.

20 Claims, 19 Drawing Sheets

Section A-A

Bit Line Select Read Path - Full Decode

Bit Line Select Read Path - Partial Decode

Bit Line Select Write Path - Full Decode

Bit Line Select Write Path - Partial Decode

SHARED BIT LINE MEMORY DEVICE AND METHOD

RELATED APPLICATION DATA

Continuation-in-part of Ser. No. 10/395,312, filed Mar. 24, 2003, abandoned.

BACKGROUND OF THE INVENTION

1. Field of the Invention

The present invention relates to digital memories. More specifically, the present invention relates digital memory arrays organized in rows and columns and used in various digital devices.

2. Description of the Related Art

Modern computing devices utilize a variety of kinds of memory devices to store and access information. Several memory device technologies are familiar to those skilled in the art and include the general classes of random access memories ("RAM") and read only memories (ROM"). These classes further comprise static RAM ("SRAM"), dynamic RAM ("DRAM"), programmable ROM ("PROM"), erasable PROM ("EPROM"), electrically erasable PROM ("EEPROM"), as well as FLASH memory, smaller register files, and other memory types known to those skilled in the art. Most memory devices employ an internal architecture in the form of an array of bit-cells, comprised of plural rows and plural intersecting columns. This architecture is beneficial in allowing random access to the memory, and in minimizing the number of circuit components needed to implement any given memory array size. A memory bit-cell is placed at each intersecting row and column in the array. Activating a bit-cell's row and then reading or writing the state of its column provides access an addressed bit-cell. Some memory devices employ dual, or multiple, ports. When multiple access ports are provided in a memory, the number row and column conductors are increased proportionately to the number of ports implemented. Memory sizes are defined by the row and column architecture. For example, a 1024 row by 1024 column memory array defines a memory device having one megabit of memory bit-cells. The memory bit-cells are often times arranged into logical groups of memory bits, called words. A convention has emerged in the art, where the array row conductors are referred to as word-lines and the memory column conductors referred to as bit-lines.

Memory devices are most commonly implemented as semiconductor integrated circuits, which are built up in multiple layers on a semiconductor die. Such circuits are know to those skilled in the art and are comprised of ion doped semiconductor circuit devices, such as diodes and transistors, formed on a substrate and interconnected with metallic traces. During manufacturing, multiple layers of circuitry are built up upon one another, separated with insulating layers. In memory devices organized in the aforementioned array structure, the word-lines and bit-lines are formed with long metallic or poly traces that are electrically tapped at each array junction, where a memory bit-cell has been formed. During manufacture, transistors are formed by diffusing ions into the undoped substrate. By using masking techniques, the various parts of the active devices are arranged. A first metal layer above the diffused transistor layers is called "Metal-1". In addition, a contact layer is formed between the transistors and Metal 1 that includes holes in the insulating oxide between Metal-1 and the individual transistors' sources, drains and gates, which allows Metal-1 to connect down to the transistors. However, other semiconductor and passive devices are also used, as are known to those skilled in the art. Due to cost, yield, and performance issue that surround the design and manufacture of memory devices, designers are continually challenged to implement logic and schematic designs in an efficient design realizable in a physical memory device. In fact, the conversion of a schematic memory design to a physical device design is the essential challenge in memory design. For any given memory technology, there are a set of minimum design rules that establish the limits of element size and performance. For example, the width of FET channels, the width and thickness of conductive traces, the minimum spacing between layers and between parallel conductive traces, etc. In an efficient memory design, based on minimum design rules, every layer of the device will be fully populated and tightly arranged for maximum utilization of available semiconductor area.

In a typical memory array device, each memory cell is comprised of some number of semiconductor devices interconnected to form the memory bit-cell. For example, in a static memory, each memory cell is formed with four transistors that are interconnected to implement a bit-latch, which is then coupled to corresponding bit-lines with a pair of transistor pass-gates. Thus, each memory bit-cell is created using six transistors. Of course, other memory technologies use other numbers of transistor and/or passive devices. The nodes of the various transistors are interconnected through the aforementioned Contact layer, which is coupled to a first metallic trace layer, known as "Metal-1". More metallic trace layers can be added to the integrated circuit, each coupling down to Metal-1 layer. However, it is important to note the significant fact that only the "Metal-1" and "Contact" layers afford direct connection to the semiconductor device nodes. When designers generate memory integrated circuit layouts, the space available on the Contact and Metal-1 layers are at a premium and can be a limiting factor in device size and density. Several design rules known to those skilled in the art limit the degree of integration and miniaturization possible. At some point in the design, the only way to reduce the device size or increase its density is to somehow eliminate some of the circuit components or interconnecting metallic traces and connection nodes.

Another aspect in the design of high-density memory device is the complex nature of the interconnection of the array of bit-cells to the associated addressing, decoding and read/write access circuitry. Generally a large number or word-lines rows and bit-lines columns are routed on the upper metal layers of the integrated circuit die. The intersections of the rows and columns define the access locations for each of the plural bit-cells in the array. In particular, the intersection of one word row and one bit column are used to access a single memory bit-cell to either read the data therein or write new data thereto. In the case of multiple port memory arrays, the number of word row and bit column metallic traces is even greater. In the case of a static memory device, each bit column is actually comprised of two bit-lines, a bit-true and bit-compliment line. The differential voltage between the two being used to determine the memory cell contents during a read operation, as well as forcing the state of the bit-cell in a write operation. Access to a particular bit-cell is addressed by enabling that bit-cell's corresponding word-line and then reading its corresponding bit-line. With a large number of parallel metallic traces running crisscross through the chip, and given that fact that each word-line activation turns on all of the bit-cells in a given row, the magnitude of the capacitive load being driven is significant. In addition to the metal-to-ground and metal-to-metal capacitance that the metallic trace routing defines, there is the node capacitance of all the devices that are coupled to an activated row or column. The capacitance is significant because the current needed to drive the circuit depends on the magnitude of the capacitive load. Current flow, or power consumption, in a capacitive circuit is quantified as the circuit capacitance multiplied by the first derivative of the change in voltage with respect to time. Thus, power consumption in the active state of accessing a memory cell is proportional the number of traces and circuit elements that are being driven over the voltage change of the read or write operation in progress.

The problem of excessive capacitive load in memory array read and write operations has been addressed in a separate patent application made by the inventor of the present invention. Filed in U.S. patent application Ser. No. 10/189,072 to Sheppard, entitled MEMORY DEVICE AND METHOD WITH IMPROVED POWER AND NOISE CHARACTERISTICS, the invention describes a way to use multiple word-lines per row to access a fractional part of each row of bit-cells so that the capacitive load of each access is fractionally reduced. Hereinafter, this technology will be referred to as "Multiple Word Line" technology. The Multiple Word Line technology results in lower power consumption and improved noise characteristics over the prior art. The contents of the Multiple Word Line patent application are hereby incorporated in the present disclosure by reference thereto. The additional word-line traces in the related invention are not objectionable because they are implemented in the upper metal layers and do not generally compromise the designer's ability to tightly integrate and miniaturize the integrated circuit design.

Notwithstanding the improvements in the prior art, there still exist practical limits on memory array circuit density in the prior art. The advantages of reduced die size, including lower parts cost and higher manufacturing yields, cannot be realized because of the high number of traces and circuit interconnections required in prior art memory array integrated circuit designs. In the case of multiple port memory devices, this problem is exacerbated. The problem in the prior art is defined and bounded by the need to interconnect plural bit-lines with sense amplifiers, pre-charge circuits, write circuits, and the memory bit-cells themselves, as well as the practical limits on the number of circuits that can be interconnected through the Contact and Metal-1 layers. Thus, there is a need in the art to reduce the number of bit-lines, reduce the number of circuit interconnections and generally reduce the size and complexity of memory array layouts.

SUMMARY OF THE INVENTION

The need in the art is addressed by the apparatus and methods of the present invention. A memory is taught that is formed from an array of plural bit-cells organized as plural columns and plural rows. Plural word-lines are aligned with the plural rows, with each of the plural word-lines electrically coupled to a discrete fraction of all bit-cells that lie along its corresponding one of the plural rows. The memory also includes plural bit-lines that are aligned with the plural columns. Each of the plural bit-lines is electrically coupled to all of the bit-cells that lie along at least a single corresponding one of the plural columns. In addition, at least a first one of the plural bit-lines is further electrically coupled to all of the bit-cells that lie along a number of the plural columns. The number is equal to the inverse of the fraction. This first bit-line is coupled such that every one of the plural bit-cells, that lie along any given row of the plural bit-cells that are coupled to it, is coupled to a unique one of the plural word-lines.

In a refinement of the foregoing invention, the number of word-lines aligned with each of the plural rows is an integer number that is greater than one. In particular, that number may be a power of two. In a specific embodiment of the invention, the memory is arranged such that no two bit-cells within each of the discrete fractions of the plural bit-cells along any given row are positioned adjacent to one another. In another embodiment of the invention, the memory further includes a row and column decoder. It is coupled to the plural word-lines and the plural bit-lines, and operates to selectively activate an individual one of the plural word-lines aligned with a particular row. Also, it operates to decode one or more of the plural bit-lines that are coupled to bit-cells which are activated by the presently selected individual word-line, based on an address of one or more bit-cells.

In another specific embodiment of the invention the plural bit-cells each include multiple access ports. Then, the plural bit-lines and the plural word-lines are arranged in multiples according to the number of multiple ports in the plural bit-cells. In a refinement to this embodiment, the first one of the bit-lines is electrically coupled to a first port on each of the bit-cells that lie along the number of columns. Then, at least a second one of the plural bit-lines is electrically coupled to a second port on each of the number of columns. The second port is coupled such that every one of the plural bit-cells that lie along any given row, that are coupled to the second bit-line, is also coupled to a unique one of the plural word-lines.

In a refinement to the memory, the plural bit-cells are dynamic memory bit-cells. And, the number of the plural bit-lines equals the number of the columns multiplied by the fraction. In another refinement, the plural bit-cells are static memory bit-cells. Then, the number of the plural bit-lines equals one plus the number of the columns. Also, each of the plural bit-cells is electrically coupled to each of a bit-true and a bit-compliment pair of bit-lines. And, at least one bit-lines functions as the bit-true or bit-compliment bit-line for two adjacent columns. In yet another embodiment, the plural bit-cells are static memory cells. Each cell includes a bit-latch and at least a first pass-gate. The pass-gate is enabled by assertion of the corresponding word-lines electrically coupled thereto.

The present invention also teaches a particular static random access memory. This memory includes an array of plural static memory bit-cells, each having a bit-latch coupled between a bit-true pass-gate and a bit-compliment pass-gate, and organized as plural columns and plural rows. The memory also includes plural word-lines aligned with the plural rows, each of the rows having a number of word-lines aligned therewith. The number is equal to a power of two. Each one of the word-lines is electrically coupled to the bit-true and bit-compliment pass-gates of a fraction, equal to the inverse of the number, of all of the plural bit-cells that lie along the corresponding one of the plural rows. The arrangement provides that no two bit-cells within each of the discrete fractions of the plural bit-cells along any given row are positioned adjacent to one another. The memory also includes plural bit-lines, the quantity of which is equal to one plus the number of the columns, aligned with the plural columns. Each of the plural bit-lines is electrically coupled to a pass-gate in each of bit-cells that lie along at least a single corresponding one of the columns. At least a first one of the plural bit-lines is further electrically coupled to a pass-gate in each of the plural bit-cells that lie along additional columns. The total quantity of coupled columns being equal to the power of two. Also, at least a first one of the bit-lines is coupled such that every one of the plural bit-cells, that lie along any given row that are coupled to the first bit-line, is coupled to a unique one of the word-lines.

The present invention also teaches a method of accessing a memory. The method is applied in a memory that has an array of plural bit-cells organized as plural columns and plural rows. There are plural word-lines aligned with the plural rows. Each of the plural word-lines is electrically coupled to a discrete fraction of all of the plural bit-cells that lie along its corresponding row. The memory also includes plural bit-lines aligned with the plural columns. Each of the bit-lines is electrically coupled to all of the bit-cells that lie along at least a single corresponding column. At least a first one of the plural bit-lines is electrically coupled to all of the bit-cells that lie along additional columns. The total number of columns coupled to the first bit-line is equal to the inverse of the fraction. The first bit-line is coupled such that every one of the plural bit-cells, that lie along any given row of bit-cells that are coupled to the first bit-line, are coupled to a unique one of the plural word-lines. The method includes the steps of asserting a first word-line coupled to a first bit-cell that is also coupled to the first bit-line, thereby enabling the first bit-cell. Next, accessing the first bit-line to read or write the data in the first bit-cell. Then, asserting a second word-line coupled to a second bit-cell that is also coupled to the first bit-line, thereby enabling the second bit-cell, Finally, accessing the first bit-line to read or write the data in the second bit-cell.

In a specific embodiment of the method, the integer number is a power of two. In a refinement to the method, the memory is arranged such that no two bit-cells within each of the fractions of plural bit-cells are positioned adjacent to one another. In a particular embodiment, the plural bit-cells are dynamic memory bit-cells and the number of plural bit-lines equals one-half the number of columns. In another particular embodiment, the plural bit-cells are static memory bit-cells and the number of plural bit-lines equals one plus the number of columns. Also, each of the plural bit-cells is electrically coupled to each of a bit-true and a bit-compliment pair of the plural bit-lines. In another specific embodiment, the plural bit-cells are static memory cells, each including a bit-latch and at least a first pass-gate. Then, the asserting steps further include the step of enabling the pass-gates of the bit-cells along the row aligned therewith.

In another particular embodiment, an N-port memory, where N is the number of ports, is taught. The memory includes an array of plural bit-cells that are organized as plural columns and plural rows. Plural word-lines are aligned with the plural rows, where each of the plural word-lines is electrically coupled to a discrete fraction of all of that portion of the plural bit-cells that lie along the corresponding one of the plural rows. Each of the plural rows has N times the inverse of the fraction of the plural word-lines aligned therewith. Plural bit-lines are aligned with the plural columns, and each of the plural bit-lines is electrically coupled to all of that portion of the plural bit-cells that lie along at least a single corresponding one of the plural columns. Also, at least a first one of the plural bit-lines is electrically coupled to all of the plural bit-cells that lie along an integer multiple of N number of the plural columns, and also coupled such that every one of the plural bit-cells, that lie along any given row of the plural bit-cells that are coupled to the first bit-line, is coupled to N unique ones of the plural word-lines. Finally, plural conductive elements are aligned in parallel with the plural bit-lines along a substantial portion of the length of the plural bit lines. The plural conductive elements are interspersed with the plural bit lines such that no two of the plural bit lines that are simultaneously accessed during a memory read or write operation are adjacent to one another over a substantial portion of their respective lengths.

In a specific embodiment of the foregoing invention, no two bit-cells within each of the discrete fractions of the plural bit-cells along any given row are positioned adjacent to one another. In another embodiment, the plural conductive elements include power supply traces, ground traces or word line traces. The array of plural bit cells may be organized into data slices that are N bits wide. In a refinement, the memory further includes bit-line select logic circuitry coupled to the plural bit lines that operate to enable read and write operations on the plural bit-lines, and wherein address coupling conductive traces at the boundary of the data slices couple across the boundaries of the data slices. In another specific embodiment the layout of bits-cells in the data slices include mirror-image layouts that are reflected about a line on the edge of a bit-cell. The output of the bit-line select logic circuitry may be hard wired to a fraction of the plural bit-lines, which are located adjacent to the line about which layouts are mirror imaged. In one embodiment, the multiple port memory is a register file.

The present invention also teaches a method of accessing an N-port memory. The memory includes an array of plural bit-cells organized as plural columns and plural rows, with plural word-lines aligned with the plural rows. Each of the plural word-lines are electrically coupled to a discrete fraction of all of the plural bit-cells that lie along its corresponding row. Each of the plural rows has N times the inverse of the fraction of the plural word-lines aligned therewith, and with plural bit-lines aligned with the plural columns. Each of the bit-lines is electrically coupled to all of the bit-cells that lie along at least a single corresponding column. At least a first one of the plural bit-lines is electrically coupled to all of the bit-cells that lie along an integer multiple of N number of the plural columns. They are coupled such that every one of the plural bit-cells that lie along any given row of bit-cells that are coupled to the first bit-line, are coupled to N unique ones of the plural word-lines. The memory has plural conductive elements aligned in parallel with the plural bit-lines along a substantial portion of the length of the plural bit-lines. The plural conductive elements are interspersed with the plural bit-lines such that no two of the plural bit-lines that are simultaneously accessed during a memory read or write operation are adjacent to one another over a substantial portion of their respective lengths. The method includes the steps of asserting a first word-line coupled to a first bit-cell that is also coupled to the first bit-line, thereby enabling the first bit-cell. Then accessing the first bit-line to read or write the data in the first bit-cell, and asserting a second word-line coupled to a second bit-cell that is also coupled to the first bit-line, thereby enabling the second bit-cell. Finally, accessing the first bit-line to read or write the data in the second bit-cell.

In a specific embodiment of the foregoing method, the plural conductive elements include power supply traces, ground traces or word-line traces. In another embodiment, the array of plural bit-cells is organized into N bit wide data slices. In another embodiment, the memory further includes bit-line select logic circuitry coupled to the plural bit-lines for enabling read and write operations on the plural bit-lines. Address coupling conductive traces at the boundary of the data slices couple across the boundaries of the data slices. The layout of bits-cells in the data slices may be mirror-image layouts that are reflected about a line on the edge of a bit-cell. In another embodiment, the output of the bit-line select logic circuitry is hard wired to portions of the plural bit-lines that a located adjacent to the line about which layouts are mirror imaged.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

A detailed description of the present invention begins with a description of prior art memory array designs that existed before the advent of Multiple Word Line technology. Next, is a brief description of the advancements brought by the Multiple Word Line technology, which are taught in the related patent application filed by the inventor of the present invention, and which was incorporated by reference hereinbefore. It will be shown that Multiple Word-Line technology also defines a structure that enables the advancements of the present invention, which have been dubbed "Shared Bit-Line" technology by its inventor. Thus, there is conventional memory array technology, Multiple Word-Line technology and now, Shared Bit-Line technology.

Figure 1:
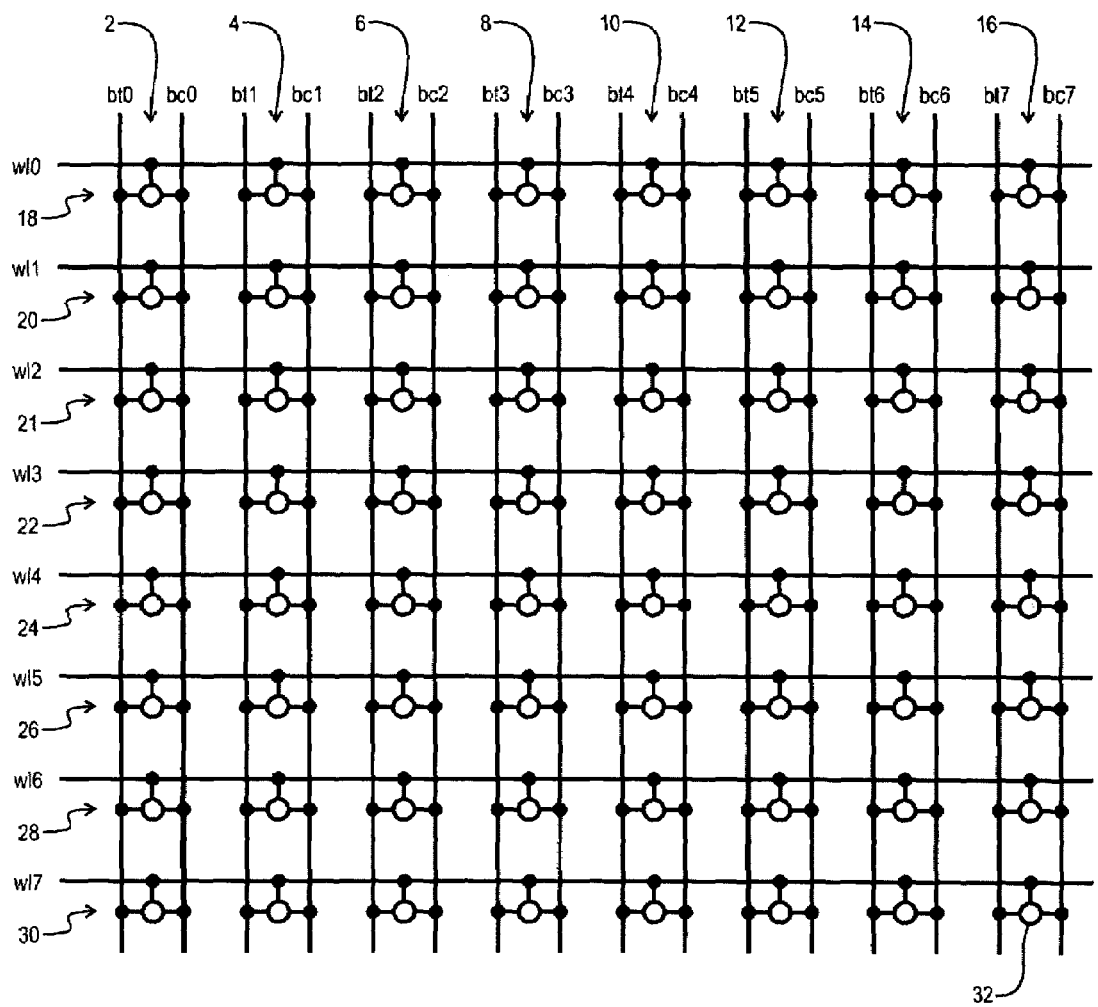
FIG. 1 is a diagram of a prior art memory array.

Reference is directed to FIG. 1, which is a conventional memory array diagram, depicting an SRAM design. While those skilled in the art will appreciate that the present invention is applicable to all memory types and memory arrays, the illustrative embodiments are drawn to SRAM and DRAM structures because these types of memory designs are rather prevalent technologies. The memory array 1 illustrated in FIG. 1 is an eight bit-cell 32 by eight bit-cell 32 array. While this size memory array 1 is not practical in most modern application due to its limited sixty-four bit storage capacity, those skilled in the art will readily appreciate that the array 1 is scalable to any size array that may be required by a memory device designer. For example, the array could be scaled to a 1024 by 1024 bit-cell array, which defines a one megabit memory array. The memory array 1 is structured into eight columns of bit-cells 32, the columns being identified in FIG. 1 by reference numbers 2, 4, 6, 8, 10, 12, 14, and 16. Each column of bit-cells is electrically coupled to two bit-lines. The bit-lines are referred to as a bit-true bit-line and a bit-compliment bit-line because of the logical state that each is defined as. The columns are arbitrarily numbered zero through seven, and so are the bit-lines. Thus, the bit-line identification convention is "bt" for the bit-true bit-lines, "bc" for the bit-compliment bit-lines, and the numbers "0" through "7" identifying the columns. The array 1 is also organized along eight rows, the rows being identified in FIG. 1 by reference numerals 18, 20, 22, 24, 26, 28, and 30. Each row of bit-cells is electrically coupled to one word-line. The rows are arbitrarily numbered from zero to seven, and so are the word-lines. Thus, the word-line identification convention is "wl" for word-line and "0" through "7" for the row number.

In operation of the memory array 1 in FIG. 1, a particular word-line is asserted to activate a particular row of bit-cells. Then, a particular bit-true and bit-compliment pair of bit-lines are accessed to read or write the bit-cell that lies at the intersection of the asserted word-line and the accessed bit-lines. Thus, a particular bit-cell is addressed as the intersection of a single word-line and a pair of bit-lines. The concept of accessing a bit-cell through its bit-lines means either reading the voltage, or logical state, of the lines in a read operation, or forcing a voltage, or logical state, in a write operation. The SRAM array 1 employs pairs of bit-lines because the state of each bit-cell 1 is determined by sensing the differential voltage between the two corresponding bit-lines. This sensing function is accomplished with a sense amplifier coupled to each pair of bit-lines (not shown). The sense amplifiers are differential amplifiers that sense a differential voltage between the two associated bit-lines. The output of each sense amplifier is indicative of the present state of the bit-cell that is addressed in an access operation. Sense amplifiers will be more fully discussed hereinafter.

Figure 2:
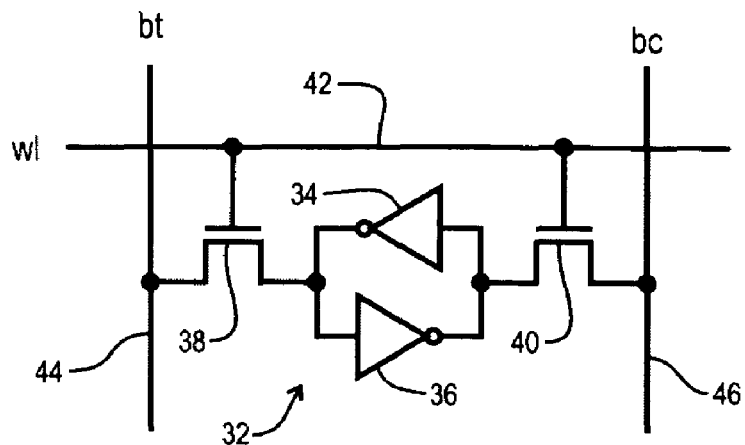
FIG. 2 is a schematic diagram of a prior art memory cell.

An individual SRAM memory bit-cell is schematically depicted in FIG. 2. The bit-cell 32 is typical of one prior art configuration of a static random access memory cell known to those skilled in the art. A pair of inverters 34 and 36 are reverse coupled to form a data latch sub-circuit. This sub-circuit is powered between the power supply voltage and ground reference of the memory device (not shown). The input/output nodes of the data latch sub-circuit are coupled through pass-gates 38 and 40, which are FET transistors. The gate terminals of pass-gates 38, 40 are coupled to the word-line 42 that is aligned with the particular bit-cell 32. In the inactive state, the word-line provides a signal that pinches-off the drain-source channel of pass-gates 38, 40 such that the data latch is isolated from the bit-lines 44, 46 by the high impedance of the pinched-off FET drain-source channels. If the pass-gates 38, 40 are P-channel devices, then the pass-gates are pinched-off with a logical high level signal. When the word-line 42 is asserted, the change of state causes the drain-source channel of each pass-gate 38, 40 to enter a low impedance state and this couples the data latch inverters 34, 36 to the bit-true bit-line 44 and the bit-compliment bit-line 46. Thus, assertion of the word-line 42 results in coupling the bit-cell 32 to the corresponding bit-lines 44, 46.

Figure 3:
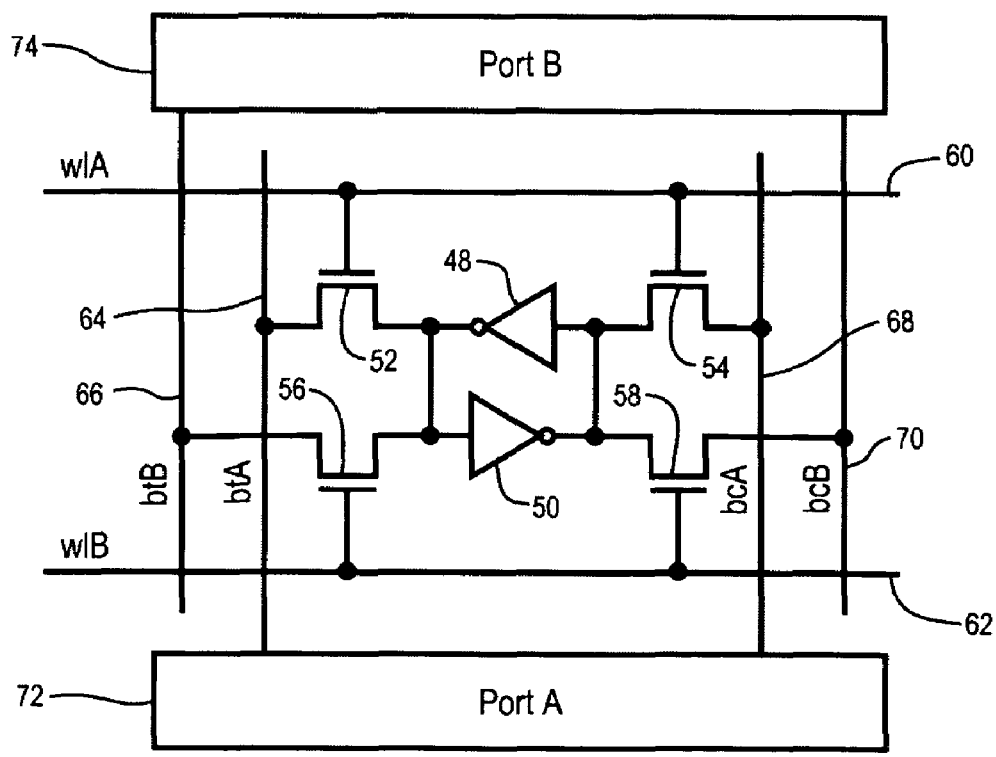
FIG. 3 is a schematic diagram of a prior art dual-port memory cell.

Reference is now directed to FIG. 3, which is a schematic representation of a prior art dual-port memory bit-cell. A dual-port memory is a species of the multiple-port class of memory arrays known in the art. A dual-port memory allows two different peripheral circuits to simultaneously access the same memory without interference. Dual or multi-port memories are particularly useful in telecom where several different circuits access the same memory. They are also useful in systems where plural busses access the same memory, sometimes at different clock rates. The dual-port bit-cell in FIG. 1 is based on a pair of inverters 48, 50 that are reverse connected to for a data latch circuit. The dual-port access is enabled by providing dual word-lines 60, 62 and dual pairs of bit-true and bit-compliment bit-lines 64, 66, 68, and 70. Notice that the word-line naming convention now includes the "A" and "B" designations for their interconnection to Port A 72 and Port B 74. So too does the bit-line name now include the "A" and "B" port references. The actual coupling to the bit-latch formed from inverters 48 and 50 is accomplished with two pairs of pass-gates. Port A 72 word-line 60 is coupled to the gate nodes of pass-gates 52 and 54, which enables coupling to the Port A bit-true bit-line 64 and bit-compliment bit-line 68. Similarly, Port B 74 word-line 62 is coupled to the gate nodes of Port B pass-gates 56 and 58, which enables coupling to the Port B bit-true bit-line 66 and bit-compliment bit-line 70. In a multiple port configuration, there will be as many pass-gate pairs as there are ports, and the number of word-lines and bit-lines will be multiplied by the number of ports as well.

As mentioned hereinbefore, some of the problems associated with conventional memory array designs were addressed by the Multiple Word-Line technology. One principle advantage of Multiple Word-Line technology is that because each word-line is coupled to only a fraction of the bit-cells in each row, then only a fraction are accessed with each word-line assertion, thereby proportionally reducing the capacitive load and current consumption of the driving devices. This results in a fractionally reduced array current. The concept of accessing a bit-cell actually means that the memory bit-cell is pulling the asserted bit-line low as a result of the pass-gate being changed to a low impedance state by the asserted word-line. At the physical level, each bit-line has its own metal capacitance, and the junction capacitance from all the pass gates that are coupled to it. To achieve the fractional coupling of each word-line, Multiple Word-Line technology requires the use of at least one additional word-line per row of bit-cells in the array so as to selectively enable a fraction of the columns with each word-line assertion.

Figure 4:
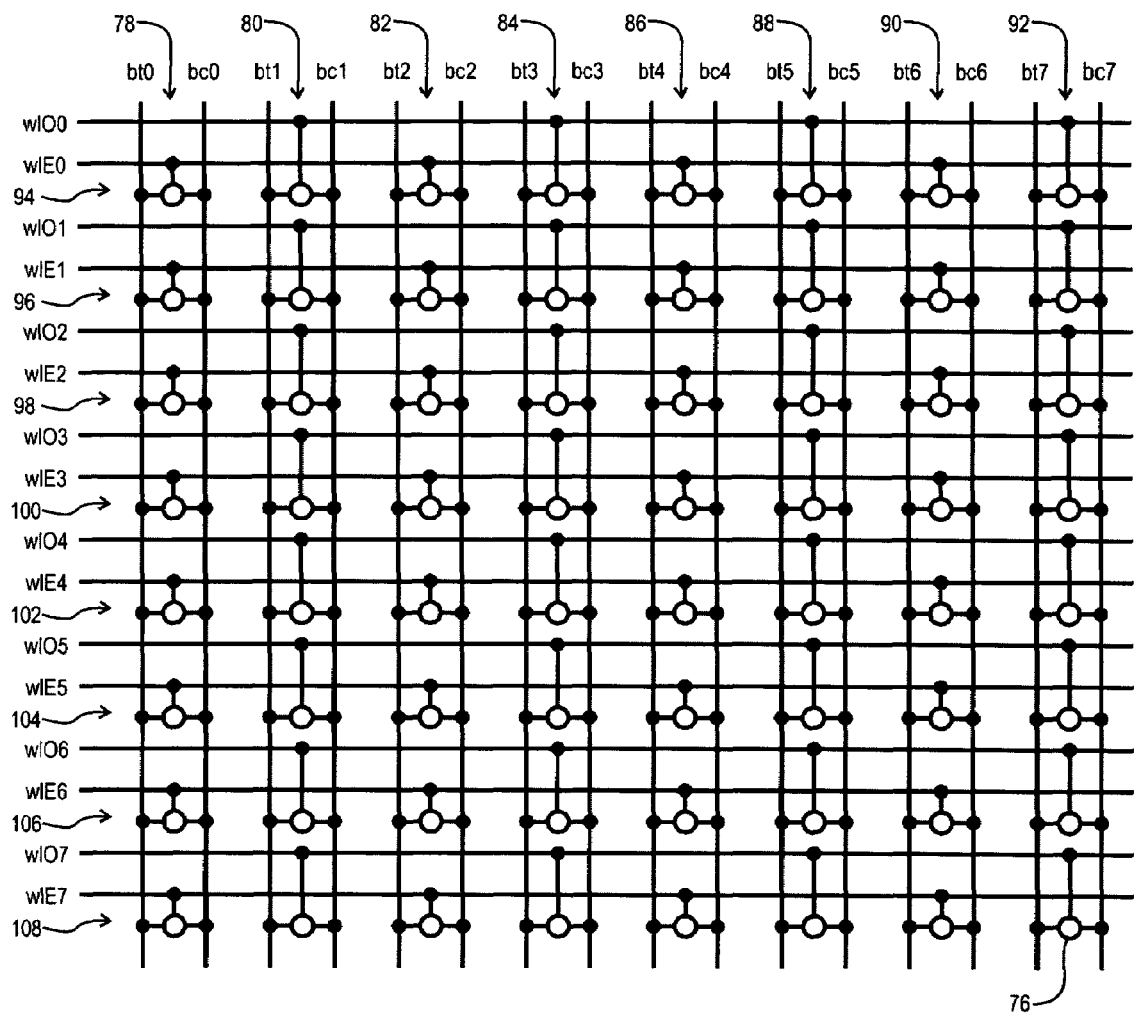
FIG. 4 is a diagram of a prior art memory array.

Reference is directed to FIG. 4, which is a memory diagram of a Multiple Word-Line memory array according to the prior art. The memory array is an array of eight by eight rows and columns of bit-cells 76. The eight columns are identified by reference numerals 78, 80, 82, 84, 86, 88, 90, and 92. The expected bit-true and bit-compliment bit-lines are aligned with each column of bit-cells, and are electrically coupled to each bit-cell in the corresponding columns. Note that the "bt0", "bc0", through "bt7", "bc7" naming convention is applied in FIG. 4. The eight rows of bit-cells are identified by reference numbers 94, 96, 98, 100, 102, 104, 106, and 108. Each row now has two word-lines aligned with it. The two word-lines are called the "odd" and "even" word lines. Hence, the row naming convention has been expanded to include "wl" for word-line, "O" or "E" for odd or even, and the numbers "0" through "7" to identify the particular rows. Each word line is electrically coupled to only a fraction of the columns, that fraction being the inverse of the number of word-lines per row, namely one-half since there are two word-lines per row. The even word-lines couple to the even numbered columns and the odd word-lines couple to the odd numbered columns.

Figure 5:
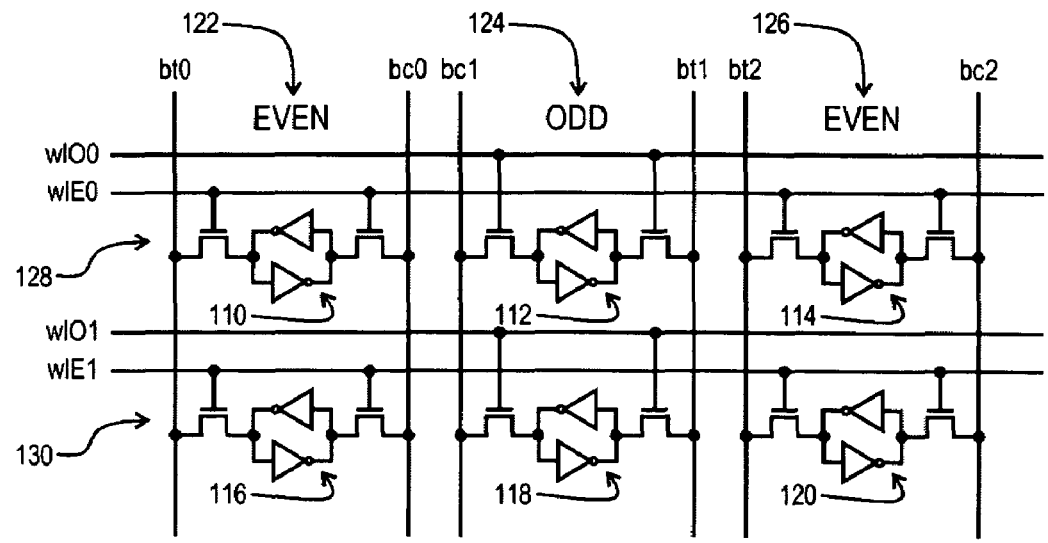
FIG. 5 is a schematic diagram of a prior art static memory array.

FIG. 5 schematically illustrates the prior art Multiple Word-Line technology as applied to a small fraction of a memory bit-cell array. There are six bit-cells, 110, 112, 114, 116, 118, and 120 arranged as three columns 122, 124, and 126 and two rows 128 and 130. Each bit-cell includes the reverse-coupled inverters forming the bit-latch and the pair of pass-gate FETs that are coupled to the odd and even word-lines according to the column numbers, as discussed above. Note the arrangement of the bit-lines in FIG. 5, they are ordered: "bt0", "bc0", "bc1", "bt1", "bt2", and "bc2". With this arrangement, no two adjacent bit-lines will ever be accessed at the same instant due to the odd and even word-line interconnection. Since the ordering of the polarity of the bit-lines is reversed in each adjacent column, the bit-true bit-lines are always adjacent to one another, as are the bit-compliment bit-lines. This fractional array illustration points to and exemplifies a problem in the prior art, even in view of the advancements of the Multiple Word-Line technology.

Memory array designers continually strive to increase the total number of bits of the integrated circuit die, reduce the power consumption, increase the speed of operation, reduce manufacturing costs, and increase manufacturing yield.

These goals tend to conflict with one another. Increasing the total number of bits increases the physical size of the die, increases capacitance, and therefore increases power consumption. A larger die will have reduced yield and increased manufacturing costs. One approach that benefits all of these design goals is to reduce the number of circuit components and conductors needed to accomplish a given design goal, such as a memory array of specific size. Reducing component count and the number and length of conductors is particular beneficial at the Contact and Metal-1 layers on the integrated circuit. Reducing the number of bit-line metal runs is particularly beneficial as well. Since the semiconductor devices are all diffused into the substrate, and all electrical connections, regardless of the number of upper metal layers, must pass through the Metal-1 layer and the Contact mask, these two layers inevitably limit the density of the device. Any reduction in the number of electrical contacts that must pass trough the Metal-1 and Contact layers allows the designer to use the extra chip real estate for other more beneficial purposes.

The word-lines and bit-lines in a memory array are typically routed on upper metal layers in the device However, word-lines and bit-lines can be routed in the Metal 1 layer as well. For example, the word-lines may be routed on a Metal-2 layer, while the bit-lines are routed on a Metal-3 layer. As these lines must connect to semiconductor devices, including the pass-gates, precharge circuitry, write circuits, read circuits, and so forth, each of these lines necessarily consumes some precious space on the Metal-1 and Contact layers of the integrated circuit. It is always desirable to reduce the number of traces on the metal layers, thereby achieving a reduction in the number of connections in the Metal-1 and Contact layers, as well as reducing the number of electrical connection nodes in the device generally. Also, it is particularly beneficial to reduce the total number of metal traces. The aforementioned fact that, due to the implementation of the Multiple Word-Line technology, adjacent bit-lines in a memory array will never be accessed simultaneously, has led to the advancements in the art of the present invention, which is called Shared Bit-Line technology.

Figure 6:
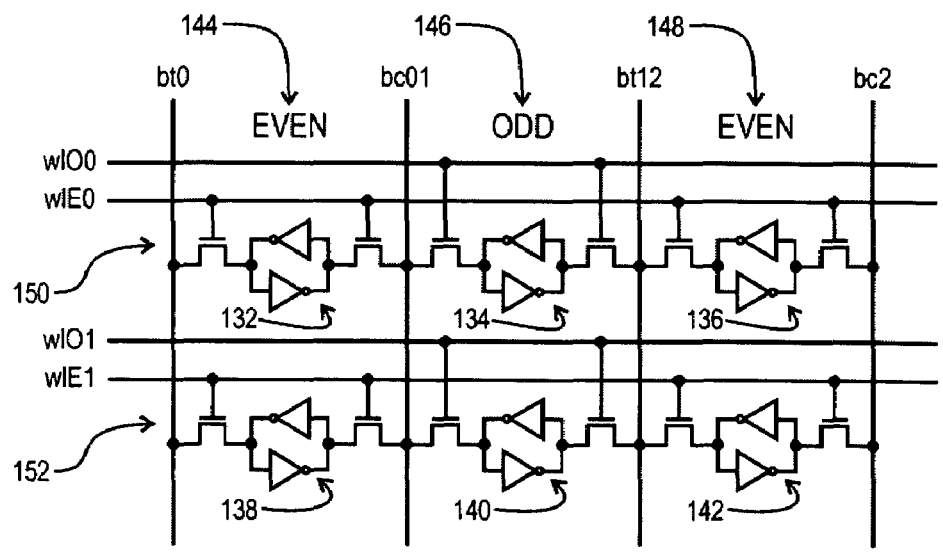
FIG. 6 is a schematic diagram of a static memory array according to an illustrative embodiment of the present invention.

Reference is directed to FIG. 6, which is a schematic diagram of a small section of an SRAM memory array according to an illustrative embodiment of the present invention. In FIG. 6, adjacent bit lines located between adjacent columns of bit-cells have been combined to reduce the total number of bit-lines needed to implement the memory array. Equally important, the number of electrical connections to the bit-lines is reduced, which further reduces the number of connections through the Contacts and Metal-1 layers, as well as a reduction in the complexity of the peripheral addressing, read/write, and precharge circuitry of the device. In particular, there are six bit-cells, numbered 132, 134, 136, 138, 140, and 142. The bit-cells are arranged into three columns numbered 144, 146, and 148, and, arranged into two rows, 150 and 152. The bit-line between columns 144 and 146 is now named "bc01" indicating that it performs the bit-compliment bit-line function for both of columns 144 (the "0$^{th}$" even column) and 146 (the "1$^{st}$" odd column). Similarly, the bit-line "bt12" located between columns 146 and 148 performs the bit-true bit-line function for both of these columns of bit-cells. This results in a halving of the number of bit-lines between each column, and equally important, results in a halving of the number of electrical connection from the bit-lines down to and through the Metal-1 and Contacts layers on the semiconductor die. This design results in a number of benefits in terms of reductions in chip size, density and complexity. Not only in the memory array itself, but also in the ancillary circuitry coupled to the array.

The reduction in the number of bit-lines illustrated in FIG. 6, and generally resulting from application of the apparatus and methods of the present invention is made possible by the use of Multiple Word-Line technology. The 0$^{th}$ row, 150, in FIG. 6 has two word-lines aligned therewith. These are the "wlO0" word-line (word-line, odd, zero row) and the "wlE0" word-line (word-line, even, zero row). Since the interconnection of the word-lines to the pass-gates in each bit-cell is along every other column, and since the addressing circuitry (not shown) never activates both of the ODD and EVEN word-lines and columns simultaneously, then each of the interconnected bit-lines never has to serve both adjacent columns of bit-cells at the same instant in time. Therefore, the address decoding circuitry for the bit-lines (not shown) can interpret the bit-line data states according to which of the ODD or EVEN word-lines has been asserted so as to accurately address every single bit-cell in the memory array. Those skilled in the art will appreciate that this design strategy can be applied to other memory arrays where more than two word-lines per row is employed. For example, if there were four word-lines per row, then each bit-line could serve up to four columns of bit-cells, and still create no addressing ambiguities. This would result in a quartering of the number of bit-line traces and connections within the memory device. Numerous other numbers and arrangements are also possible.

Figure 7:
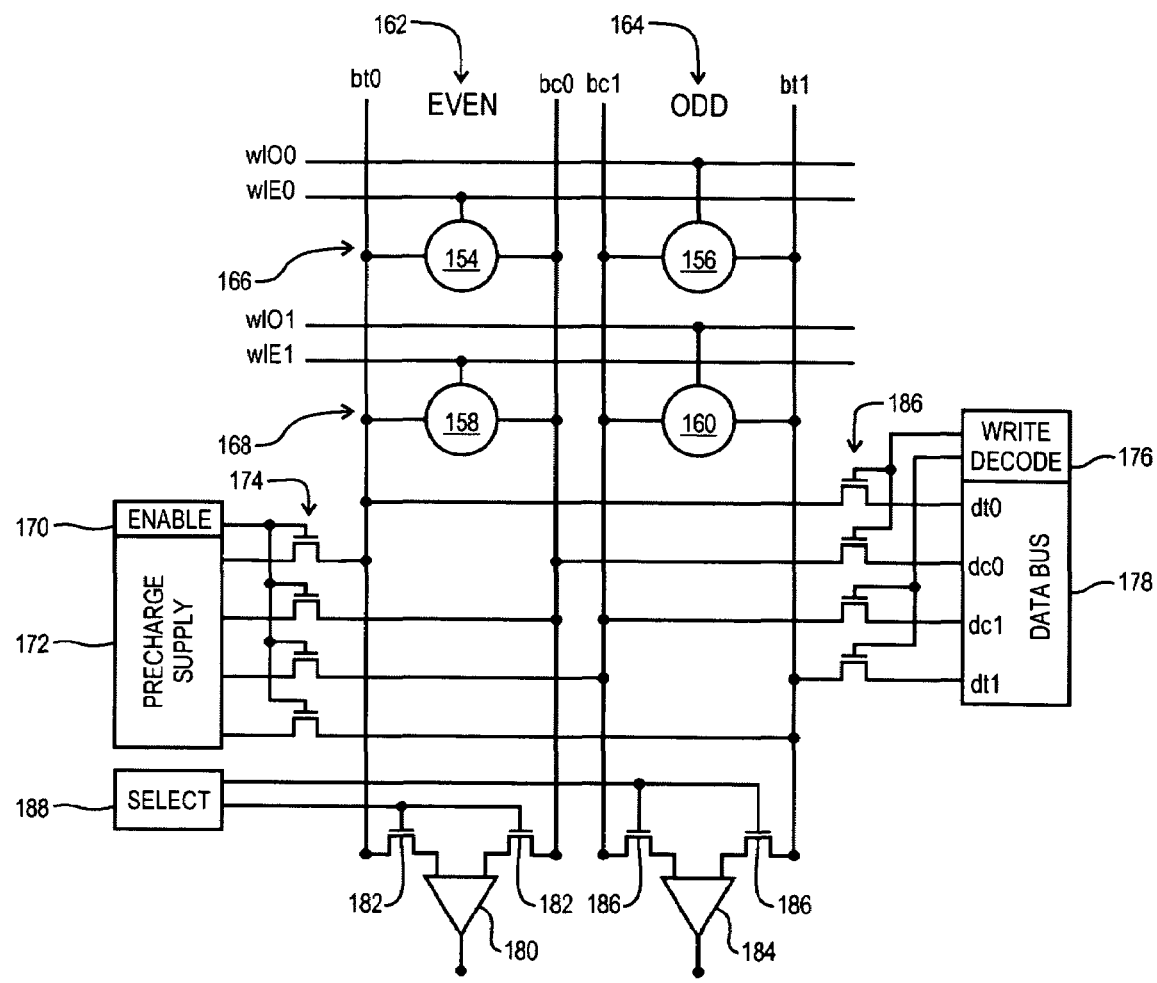
FIG. 7 is a schematic diagram of a prior art memory device.

While FIG. 6 depicts an illustrative embodiment of the present invention at the memory array level, those skilled in the art appreciate that there are various ancillary circuits typically associated with a memory array. Reference is directed to FIG. 7, which is a functional block diagram of a prior art memory device, including a small memory array and certain ancillary circuitry. The device illustrated in FIG. 7 includes the Multiple Word-Line technology but does not includes the Shared Bit-Line technology of the present invention. There are four bit-cells, 154, 156, 158, and 160, that are arranged into a two-by-two array. The array consists of two columns 162, 164, and two rows 166, 168. There is a pair of odd/even word-lines aligned with each row, which are the "wlO0" and "wlE0" for row 166, and "wlO1" and "wlE1" for row 168. Each column has its own dedicated pair of bit-lines, which are "bt0" and "bc0" for column 162, and "bc1" and "bt1" for column 164. Of course, those skilled in the art will appreciate that virtually any array dimensions could be employed. In an SRAM device as illustrated in FIG. 7, there is a precharge operation applied prior to every read or write operation. Precharge is accomplished with a precharge power supply 172 that is coupled to all of the bit-lines through plural transistors 174. At the appropriate moments in time, an enable circuit 170 activates the plural transistor 174 to couple the precharge power supply 172 to the plural bit-lines and thereby precharge the bit-lines to the desired voltage level. Note that the precharge circuitry includes as many transistors as there are bit-lines and as many connections as there are bit-lines. It is therefore clear that reducing the number of bit-lines will reduce the number of required precharge coupling transistors and the number of connections that must be made.

In an SRAM device, as illustrated in FIG. 7, the sensing of the state of the bit-cells is accomplished with sense amplifiers. There is typically a sense amplifier coupled to each column of bit-cells. Sometimes a single sense amplifier is coupled to two, four or eight columns. In FIG. 7, the bit-lines of column 162 are coupled through a pair of pass-gate transistors 182 to sense amplifier 180. The sense amplifier is typically a differential amplifier in SRAM devices. The bit-lines of column 164 are coupled through pass-gate transistors 186 to sense amplifier 184. An address selection circuit 188 activates the pass-gates of the presently accessed column during a memory read operation. Note that there is one connection made to each bit-line for coupling of the sense amplifier circuitry to the memory array. Another basic function that requires interconnection to the memory array is the write circuitry. In a write operation, a given column is accessed by asserting that column's word-line and then data is coupled to the bit-lines from a data bus 178 through plural coupling transistors 186. The circuit may also include driving transistors (not shown). Selections of the desired column, or columns, that are to be written is accomplished with a write decode circuit 176. Note that the write circuitry requires one connection to every bit-line in the memory array, as well as one coupling transistor 186 for each bit-line in the array.

Figure 8:
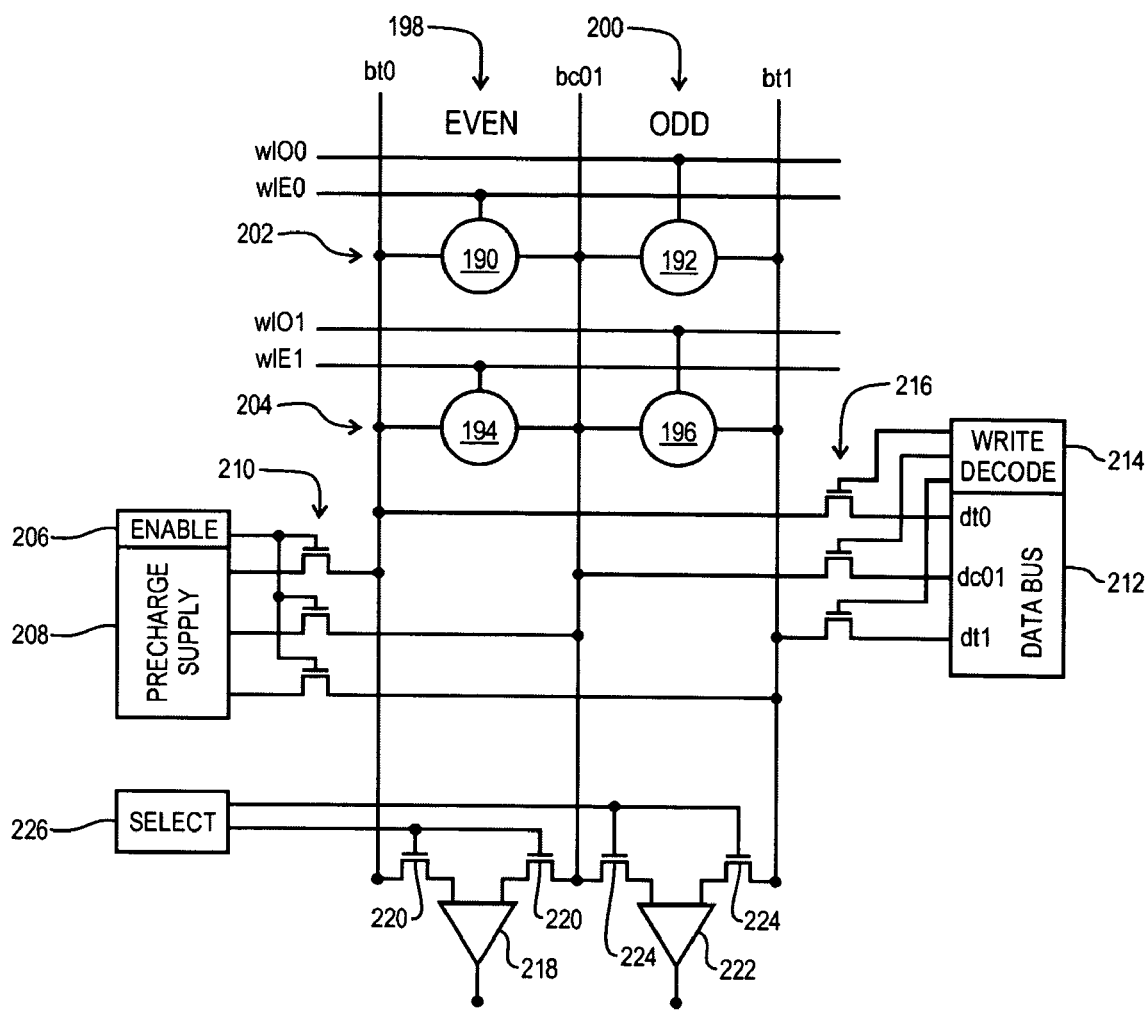
FIG. 8 is a schematic diagram of a memory device according to an illustrative embodiment of the present invention.

Reference is directed to FIG. 8, which is a functional block diagram of a memory device according to an illustrative embodiment of the present invention. The memory device in FIG. 8 incorporates both of the Multiple Word-Line and Shared Bit-Line technology. A small array of four bit-cells 190, 192, 194, and 196 are arranged into two columns 198, 200 and two rows 202, 204. An ODD and EVEN word-line are aligned with each row 202, 204 of bit-cells. The aforementioned naming convention is used in a consistent manner as the previous illustrations in this illustrative embodiment. Because the present invention Shared Bit-Line technology is employed, there is just a single bit-line between the columns 198, 200, which is named "bc01" (for bit-compliment, columns "0" and "1"). As noted hereinbefore the distinction as to which bit-cell is being accessed is made in the word-line selection and address decoding circuits. Now considering the ancillary circuits, the precharge circuitry includes a precharge power supply 208 coupled to the various bit-lines through plural coupling transistors 208, which are activated from time to time by enable circuit 206. Note that as compared to the similar circuitry in FIG. 7, the number of coupling transistors is reduced as well as the number of bit-line connections, by virtue of the reduction in the number of bit-lines. Respecting the bit-line sense amplifiers, a fist sense amplifier 218 is coupled to the "bt0" and "bc01" bit-lines that are aligned with column 198. The coupling is accomplished with a pair of pass-gate transistors 220. A second sense amplifier 222 is coupled through pass-gates 224 to the "bc01" and "bt1" bit-lines that are aligned with column 200. Thus it is shown that the "bc01" bit-line is aligned with both columns 198 and 200. The write circuitry consists of a data bus 212 coupled through plural coupling transistors 216 to each of the bit-lines. The coupling transistors are activated for write operations by write decode circuit 214. Again, note that the number of coupling transistors and the number of connections is reduced by virtue of the reduction in the number of bit-lines.

The foregoing illustrative embodiment is for the trivial case of a two-by-two memory array. In such an array the number of bit-lines is reduced from four in the prior art to three in the illustrative embodiment. This may not seem like a significant reduction, but it becomes more appreciable when it is expressed in terms of the number of columns in the memory array. For the case of a two word-line Multiple Word-Line technology implementation, the reduction in the number of bit lines is expressed by the following equation 1;

$$N=(n*2)-(n+1);\qquad\text{Eqn. 1}$$

where 'N' is the reduction in the number of bit-lines and 'n' is the number of columns. The prior art array required 'n' times two bit-lines while the illustrative embodiment require 'n' plus one bit-lines. Thus, for a two-by-two array the difference is four minus three, or just a single bit-line reduction. However, for a 1024 by 1024 array, the difference is 2048 minus 1025, which equals a reduction of 1023 bit-lines and their attendant connection nodes. The benefits are even more substantial in multiple port memories.

Figure 9:
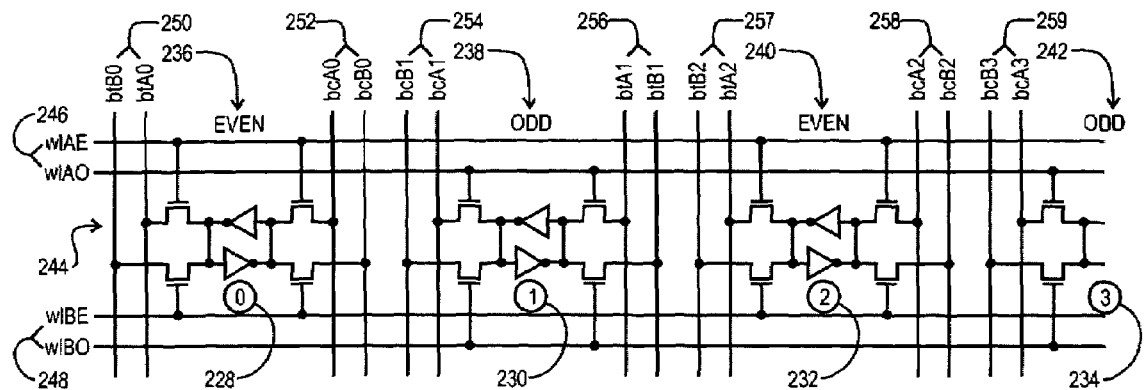
FIG. 9 is a schematic diagram of a prior art dual-port memory array.

Reference is directed to FIG. 9, which is a schematic diagram of a small portion of a prior art multiple port memory array. The memory array consists of four bit-cells 228, 230, 232, and 234 aligned along four columns numbered '0' 236, '1' 238, '2' 240, and '3' 242, also referred to as ODD or EVEN based on those numbers. Also, the bit-cells are aligned along single row 244. Each bit-cell is comprised of the familiar pair of reverse connected inverters that each forms a bit-latch. Since this is a dual port memory array, there are dual pairs of pass-gates coupled to each bit-latch. The ports are described as the 'A' port and the 'B' port, and the naming convention reflects this additional aspect of the array. Thus, the ODD and EVEN word-lines are duplicated for each of the 'A' and 'B' ports. In particular, the 'A' port word-lines 246 are labeled as 'wlAE' and 'wlAO', and the 'B' port word-lines 248 are labeled as 'wlBE' and 'wlBO'. The bit-lines are also duplicated for both the 'A' port and the 'b' port, and paired according to their polarities. In particular, the '0' bit-cell 228 has a pair of bit-true bit-lines 250 and a pair of bit-compliment bit-lines 252. For the '1' bit-cell 230, they are the bit-compliment pair 254 and the bit-true pair 256. For the '2' bit-cell 232, the bit-true pair 257 and the bit-compliment pair 258. Finally, the '3' bit-cell 234 shows just the bit-compliment pair 259, with its bit-true pair omitted from the Figure. Clearly, there are a great number of bit-lines that must be routed on the semiconductor die. This is for the simplest multiple port design, the dual port configuration. As the number of ports increases, the number or bit-lines and connections grow proportionally. Those skilled in the art will appreciate the complex design and layout issues such a memory array produces. The present invention greatly alleviates these issues.

Figure 10:
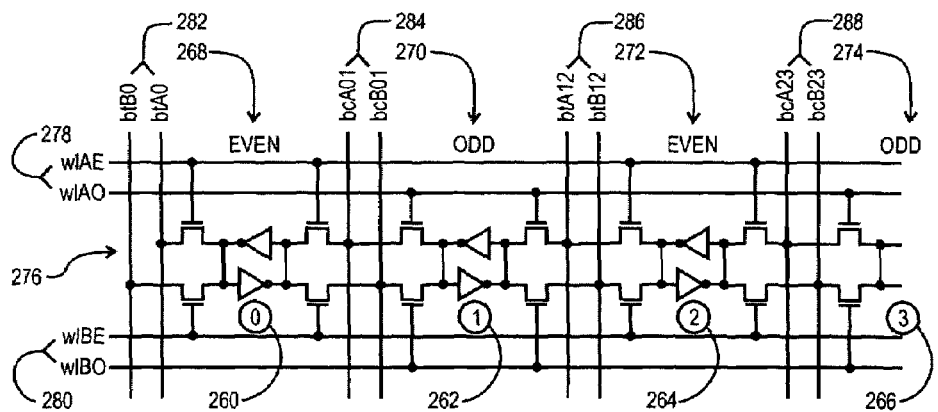
FIG. 10 is a schematic diagram of a dual-port memory array an illustrative embodiment of the present invention.

Reference is direct to FIG. 10, which is a schematic diagram of a small section of a multiple port memory array according to an illustrative embodiment of the present invention. The array consists of four bit-cells numbered 260, 262, 264, and 266, that are aligned along four columns '0' 268, '1' 270, '2' 272, and '3' 274 respectively. They are also aligned along a single row 276. This embodiment is also a dual-port configuration so there are a pair of 'A' port word-lines 278 and a pair of 'B' port word lines 280. The Shared Bit-Line technology is applied so that the bit-lines between adjacent columns are shared. In particular, columns '0' and '1' share port 'A' and port 'B' bit-compliment bit-lines 284 that are named 'btA01' and 'btB01' respectively. Note that the naming convention continues to be applied in a consistent manner. Columns '1' and '2' share bit-compliment bit-lines 286, while columns '2' and '3' share common bit-compliment bit lines 288. The arrangement of bit lines and naming convention can be adjusted according to the design of the physical device. For example, in another illustrative embodiment, the bit-true and bit-compliment bit-lines for each given port and column can be run as adjacent and parallel metallic traces on an upper metal layer. Such an arrangement is facilitated by altering the connections at the Contac and Metal-1 layers so the proper connections are made. The number of bit-lines and related connections is thus been significantly reduced. For the case of an SRAM implementation, that reduction now reflects the factor of the number of multiple ports according to the following equation:

$$N=(n*p*2)-(n*p+p);$$ Eqn. 2 where 'N' is the reduction in the number of bit-lines, 'n' is the number of columns, and 'p' is the number of ports. For a two-by-two array this is a reduction from eight bit lines to six, for a 1024-by-1024 four port array, it is a reduction from 8,192 to 4,100. Those skilled in the art will appreciate the significance of the magnitude of this reduction.

Figure 11:
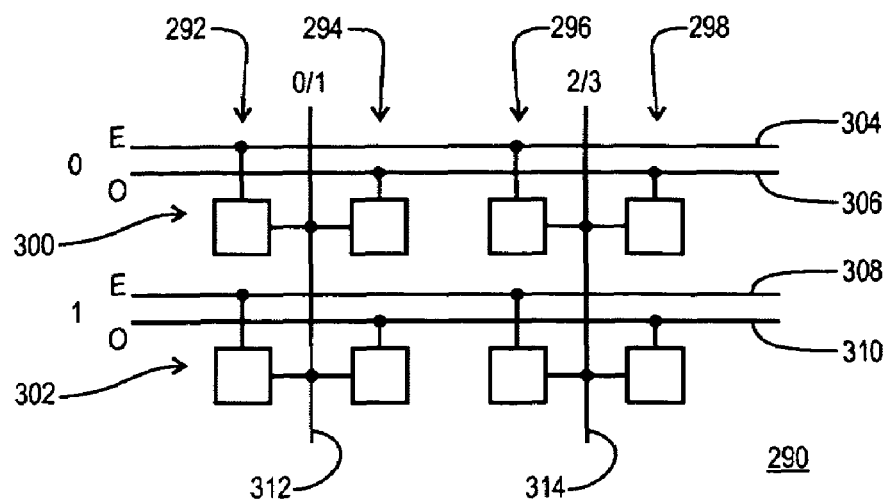
FIG. 11 is a functional block diagram of a memory array according to an illustrative embodiment of the present invention.

The foregoing examples and embodiments have been applied to SRAM devices that employ differential sensing of two bit-lines for each column in a memory array. Other memory technologies apply other numbers of bit-lines per column in the array. DRAMs are one such technology, which utilizes one bit-line for each column in a single port array. Reference is directed to FIG. 11, which is a functional block diagram of a small section of a DRAM memory array 290 according to an illustrative embodiment of the present invention. Eight bit-cells are arranged into four columns 292, 294, 296, and 298 and two rows 300 and 302. The first row 300 is row '0' and is aligned with two word lines, an EVEN word-line 304 and an ODD word-line 306. The second row is row '1' 302 and is aligned with EVEN word-line 308 and ODD word-line 310. The bit-lines are shared between adjacent columns. Thus, the '0' column 292 and the '1' column 294 share bit-line 312. And, the '2' column 296 and the '3' column 298 share bit-line 314. In a prior art approach, four bit-lines would be required, in the illustrative embodiment that number is halved.

Figure 12:
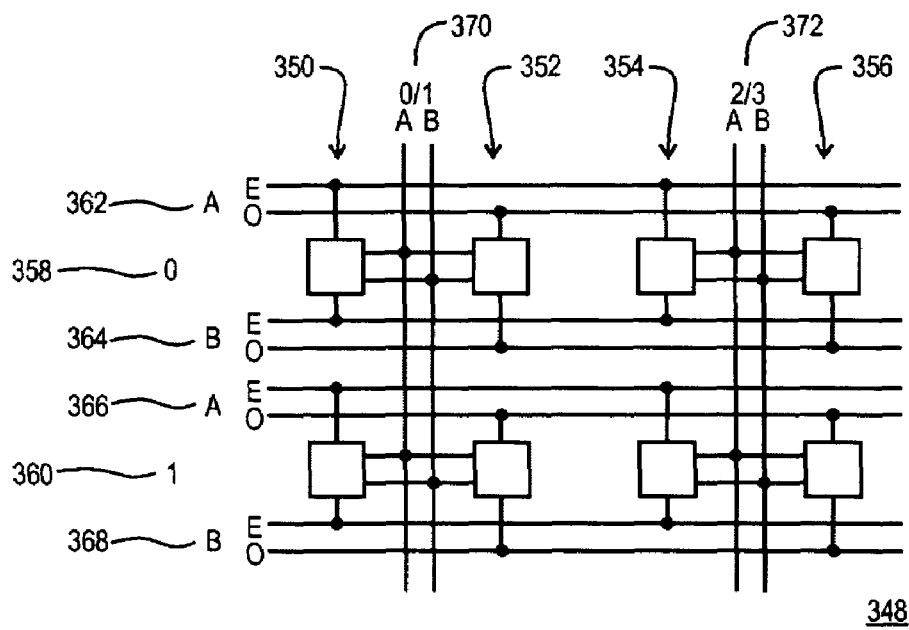
FIG. 12 is a functional block diagram of a memory array according to an illustrative embodiment of the present invention.

FIG. 12 illustrates a conceptual multiple port DRAM memory array 348 according to a proposed embodiment of the present invention. This example is a two-port memory array. Eight bit-cells are aligned in four columns 350, 352, 354, and 356, and two rows 358, 360. The first row is the '0' row 358 and has aligned therewith a 'A' port ODD and EVEN word-line pair 362 and a 'B' port ODD and EVEN word-line 364. Similarly, the second row is the '1' row 360, which has its 'A' ODD and EVEN word-lines 366 and its 'B' ODD and EVEN word-lines 368. The '0' column 350 and the '1' column 352 share common 'A' and 'B' bit lines 370. The '2' column 354 and the '3' column 356 similarly share 'A' and 'B' bit lines 372. Again, a halving of the number of required bit-lines is realized.

In addition to the various illustrative embodiments depicted in the several drawing figures discussed above, the present invention is suitable for many other memory applications. Flash memories, EEPROM, EPROM, ROM, register files, other nonvolatile memories, as well as other memory technologies that are known to those skilled in the art, or that may later become available, can benefit from the teachings of the present invention.

The teachings of the present invention are particularly beneficial in the case of multiple port memories. Those skilled in the art will appreciate that the routing of multiple port word lines and bit lines is challenging for designers, particularly as the fabrication technologies continue to shrink the physical dimensions of memory arrays. Cost and performance issues urge designers to layout memory arrays such that every layer on the silicon wafer is fully utilized and that no area in any layer is wasted. Efficient utilization of the wafer space means fully populating not only the active silicon and poly layers, but also the upper metal layers of each device. Tight circuit routing is necessary to accomplish these goals. However, as the number of word lines and bit lines increases with the number of ports, the tight routing inevitably leads to undesirable signal coupling, which leads to reduced performance of the memory device. As memory technology channel widths have decreased from micron to sub-micron, and now even into the realm of nanometer dimensions, the capacitive coupling of bit lines has become the dominant noise issue in memory designs.

In the case of larger memory technologies, junction capacitance, parallel capacitance (trace-to-ground) and side-to-side capacitance (trace-to-trace) all played somewhat comparable roles in constraining device designs, with respect to power consumption and noise considerations. However, at about the 0.25 micron sized technologies, conductive traces reached a square aspect ratio, and now, as memories are getting even smaller, the side-to-side capacitance has begun to dominate memory design constraints. At present, with 0.13 micron technology, the aspect ratio of metallic traces are taller than wide. Thus, side-to-side capacitance is now a critical factor in multiple port memories, where large numbers of parallel bit lines must be routed over a memory array.

Figure 13:
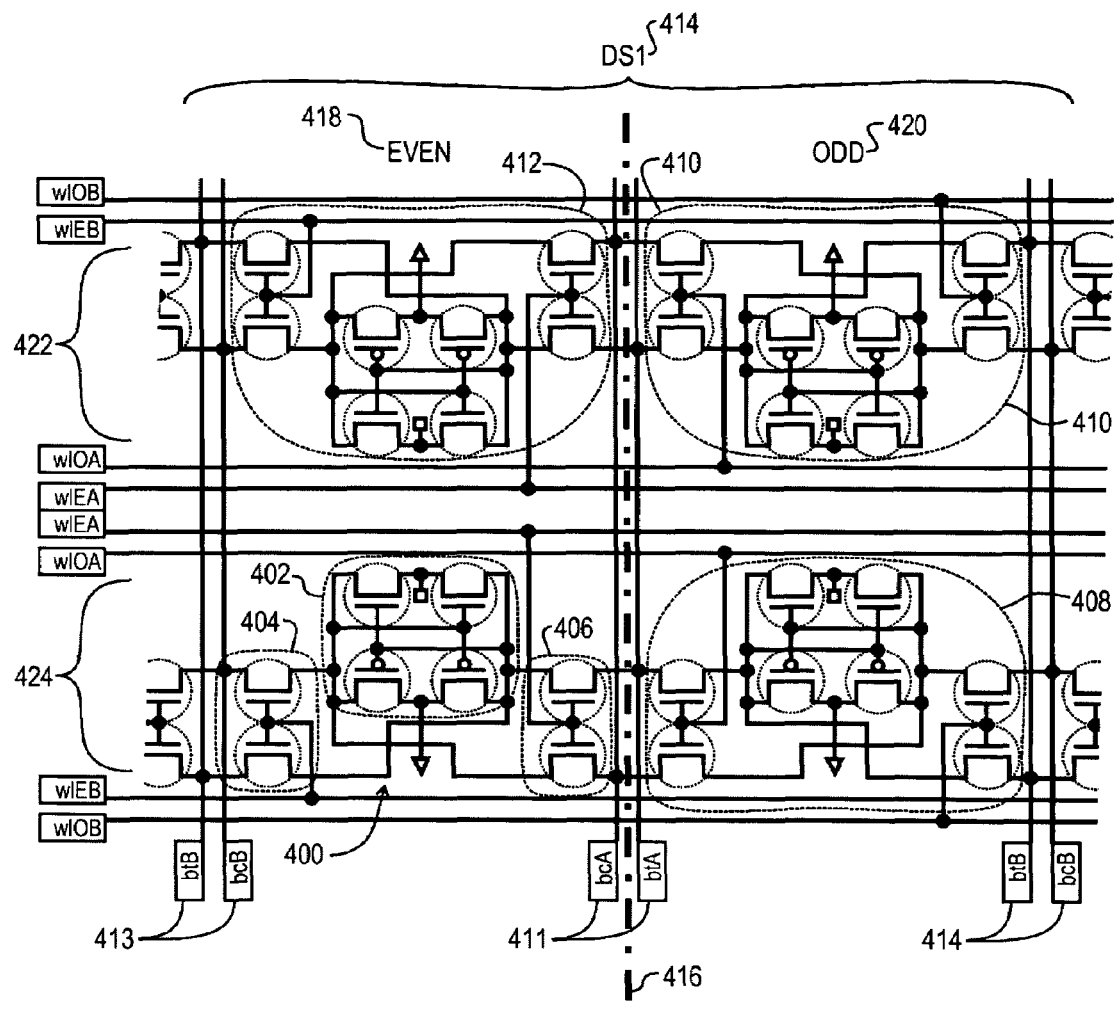
FIG. 13 is a schematic diagram of a two-by-two memory cell data-slice in an illustrative embodiment of the present invention.

Reference is directed to FIG. 13, which is a schematic diagram of a two-by-two memory cell data-slice in an illustrative embodiment of the present invention. The diagram shows four memory bit-cells 400, 408, 410, and 412, and their associated pass gates in a static RAM array. The four bit-cells are arranged into two columns, an even column 418 and an odd column 420, and, are arranged into two rows 422 and 424. This Figure is essentially a small fraction of a larger array. Note that the two columns define a data slice 414, the significance of which will become more apparent hereinafter. The arrangement of the FET components (each of which is circled in phantom) in FIG. 13 are positioned in substantial alignment with the physical layout of the array, as will be apparent when reviewing FIG. 14. In FIG. 13, note that bit-cell 400 includes four FET's that are coupled as a pair of reverse connected invertors 402. A first pair of pass gates 406 couple the invertors 402 to the A-port bit-true and bit-complement bit-lines 411. These bit-lines 411 are shared with the adjacent bit-cell 408 along the same row 424 of bit-cells. A second pair of pass gates 404 coupled the bit-cell 402 to the B-port bit-lines 413. The B-port bit-lines 413, and 414, are in-turn shared with the adjacent bit-cells on either side to the illustrated section (not shown).

The data slice 414 is comprised of two bit-cells along each row that are mirror-image layouts of one another. The line of reflection 416 illustrates the line about which the bit-cell layouts are mirrored. Memory designers understand the concept of a line or reflection 416 and a data slice arrangement, as this facilitates memory design and layout. Note in FIG. 13, that had a dual port memory without the present invention shared bit-line technology been illustrated, there would have been twelve bit-lines required, rather than the six bit-lines illustrated. In the physical layout of the memory array, the bit-lines are not located between the bit-cells as illustrated in FIG. 13, but rather they are routed with metallic traces above the bit-cells, in one of the upper metal layers.

Figure 14:
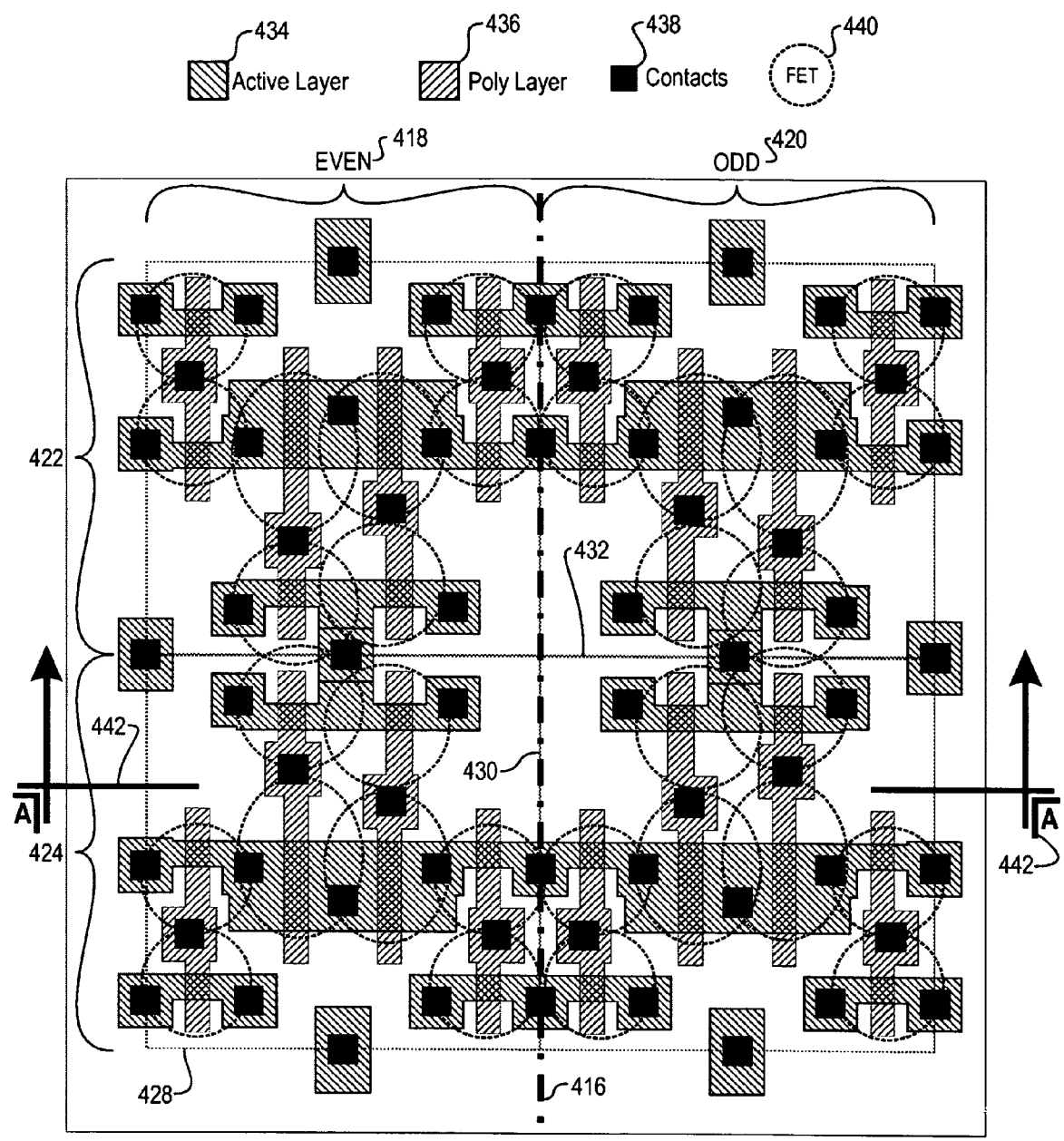
FIG. 14 is a drawing of the active and poly layers of a two-by-two memory cell data-slice in an illustrative embodiment of the present invention.

Reference is directed to FIG. 14 through FIG. 18, which illustrates the physical layers deployed in a fraction of a static RAM memory array. It should be noted that the illustrative embodiment depicts an efficiently design static RAM memory data slice using minimum design rules for the given semiconductor technology. As such, the various layers are all nearly fully populated, and the circuit traces widths are near minimum, with minimum spacing in between. Little space is wasted. FIG. 14 is a drawing of the active layer, poly layer, and contact mask in a two-by-two bit-cell fraction of a memory array, which constitutes a single width data-slice, in an illustrative embodiment of the present invention. The even 418 and odd 420 columns are indicated, as are the two rows 422, and 424, which correspond to the arrangement illustrated in FIG. 13. The boundary 428 of the two-by-two section of the array is indicated in phantom. The row boundary 432 and column boundary 430 for the illustrated four bit-cells are illustrated in phantom. The line of reflection 416, as discussed respecting FIG. 13, is illustrated in FIG. 14 as well. The FET's 440 junctions are circled in phantom as well, and generally correspond to the layout illustrated in FIG. 13. In FIG. 14, a section line 442 is shown, which indicates the point of view for the sectional drawing in FIG. 18. In FIG. 14, the active layer 434 is formed by diffusing dopants into the semiconductor substrate, as is known to those skilled in the art. A thin oxide layer (not shown) is applied on top of the active layer 434, and provides the needed insulation for the FET junctions. The poly-R layer 436 is applied on the thin oxide, and, both of these layers are masked to form the needed contact windows 438, which electrically couple the FETs 440 to the Metal-1 and other metal layers.

Note that in FIG. 14, the layout of the bit-cells is reflected about the line of reflection 416. Hence, the layouts of the even column 418 bit-cells are a mirror image of the odd 420 column bit-cells. The mirroring propagates through the upper metal layers as well. This is an important design tool for memory designers because it allows the designer to design a single cell, then reflect its layout to create a data slice. The data slice is then repeated over and over until the needed memory width, and height are realized.

Figure 15:
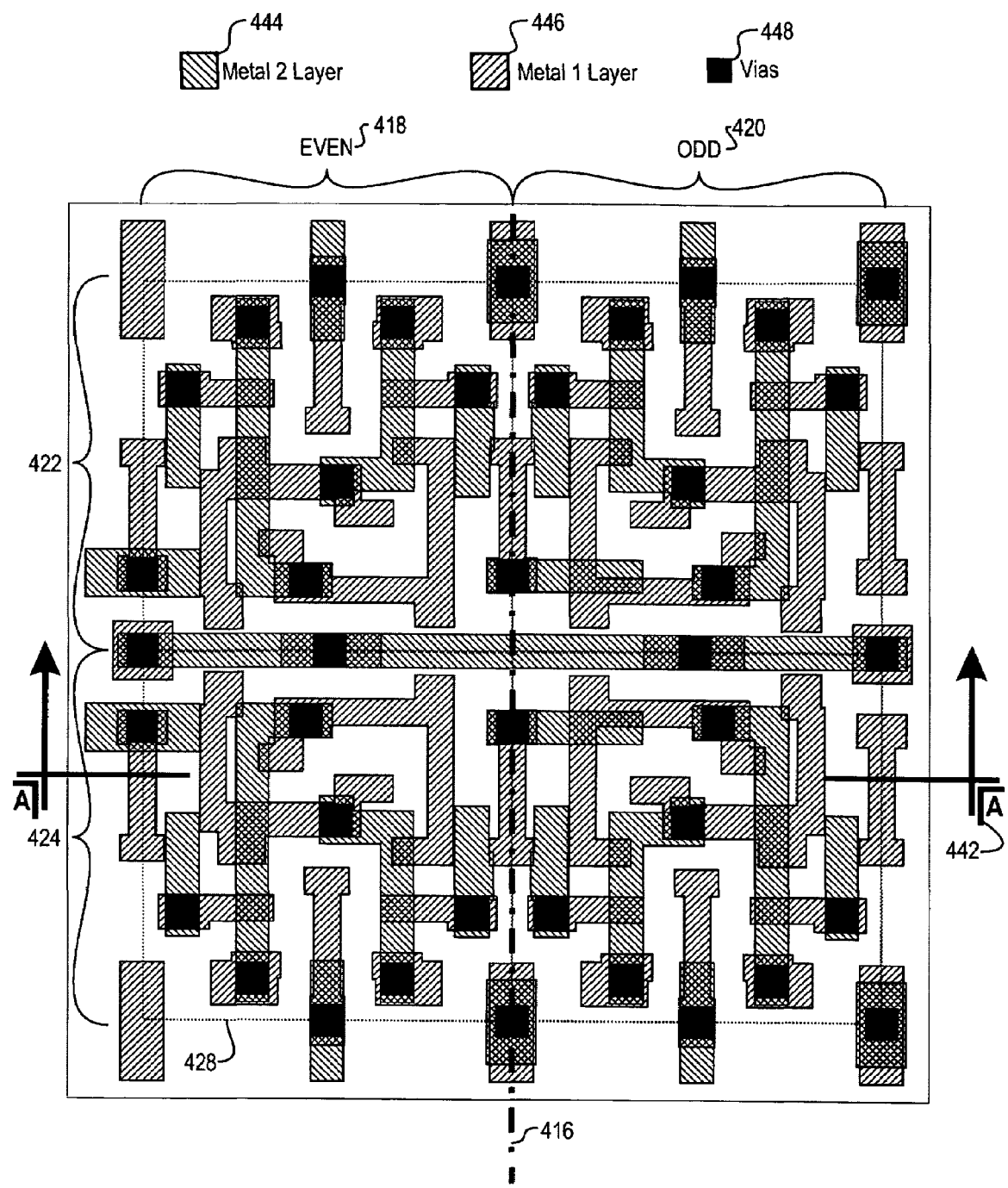
FIG. 15 is a drawing of the Metal-1 and Metal-2 layers of a two-by-two memory cell data-slice in an illustrative embodiment of the present invention.

Reference is directed to FIG. 15, which is a drawing of the Metal-1 444 and Metal-2 446 layers of the two-by-two memory cell data-slice in an illustrative embodiment of the present invention. The even 418 and odd 420 columns are identified, as are the two rows 422 and 424, which correspond to the layout in FIG. 13 and FIG. 14. The line of reflection 416 and sectional view indicate 442 are also illustrated. The Metal-1 444 to Metal-2 446 layers are coupled though an insulted mask which reveals plural "vias" 448 that interconnect the two layers. Note that the Metal-1 layer 444 also couples to the contacts 438, which were illustrated in FIG. 14. Thus, one skilled in the art will be able to trace circuits amongst the various FETs in the memory array. Note the two-by-two cell boundaries 428 are indicated and that the layers mirror about the line of reflection 416.

Figure 16:
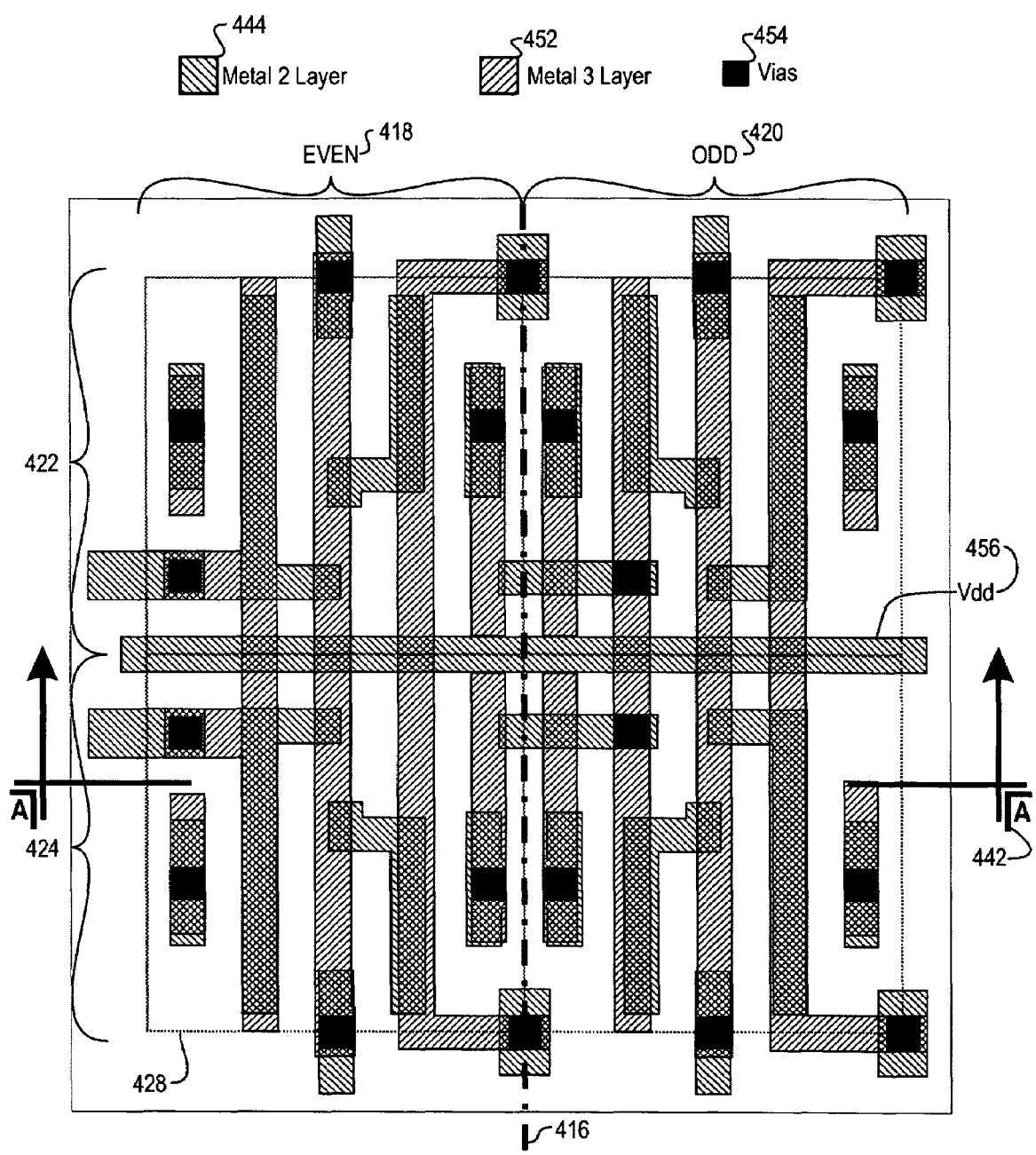
FIG. 16 is a drawing of the Metal-2 and Metal-3 layers of a two-by-two memory cell data-slice in an illustrative embodiment of the present invention.

Reference is directed to FIG. 16, which is a drawing of the Metal-2 450 and Metal-3 452 layers of the two-by-two memory cell data-slice in an illustrative embodiment of the present invention. The metal-2 layer 444 is the same as illustrated in FIG. 15. In FIG. 16, the vias 454 between these two metal layers are illustrated as well. The even 418 and odd 420 columns are indicated, as are the two rows 422 and 424. The cell boundary 428, the line of reflection 416, and sectional view indicator 442 are also illustrated. The power supply line "Vdd" 456 is indicated, which lies on the Metal-2 444 layer. Note that the Metal-3 layer 452 is also mirrored about the line of reflection 416.

Figure 17:
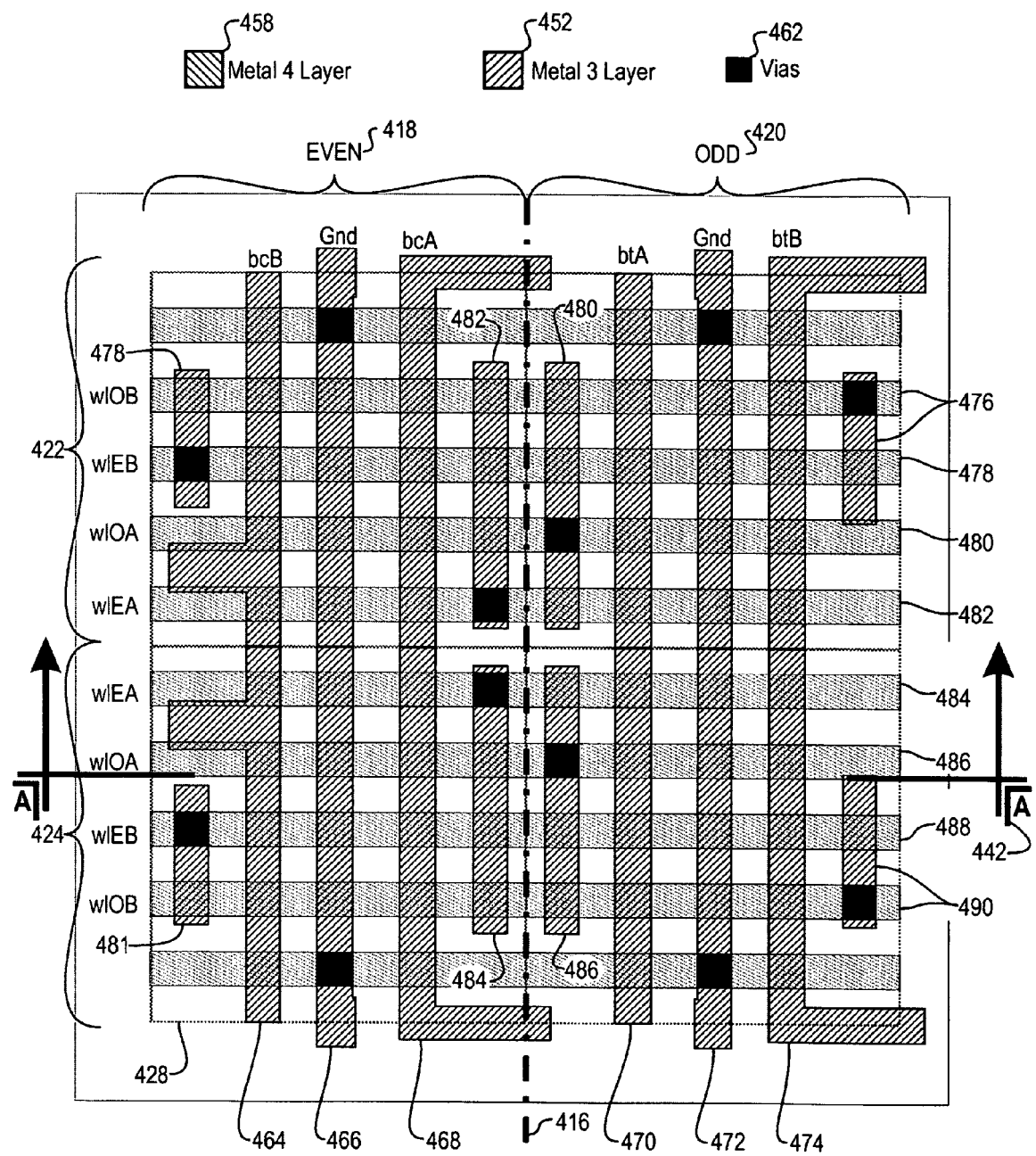
FIG. 17 is a drawing of the Metal-3 and Metal-4 layers of a two-by-two memory cell data-slice in an illustrative embodiment of the present invention.

Reference is directed to FIG. 17, which is a drawing of the Metal-3 452 and Metal-4 458 layers of the two-by-two memory cell data-slice in an illustrative embodiment of the present invention. As with the previous layout figures, the even 418 and odd 420 columns are indicated, as are the rows 422, 424, the cell boundaries 428, the line of reflection 416, and the sectional view indicator 442. The vias 462 between the Metal-3 452 and Metal-4 458 layers are also shown. The Metal-4 layer, like all of the aforementioned layers, is also reflected about the line of reflection 416. Thus, those skilled in the art will be able to fully comprehend the electrical interconnections of the illustrative embodiment memory through analysis of the several figures illustrating the array layout. The Metal-4 layer 458 is used to route the dual port word-lines in the array. In particular, the upper row 422 has the port 'B' word-lines odd 476 and even 478, and the port 'A' word-lines odd 480 and even 482 routed above it. Similarly, the lower row 424 has the port 'A' word-lines even 484 and odd 486, and the port 'B' word-lines even 488 and odd 490 routed above it. Note the reflected arrangement of the word-lines. FIG. 17 clearly illustrates certain advantageous aspects of the present invention with regards to the bit-lines routed in the Metal 3 layer 452.

Note, in FIG. 17, that the Metal-3 layer 452 is comprised of the shared bit true and bit compliment lines, as well as a capacitive isolation feature made possible by the reduced number of bit-lines required to implement a multiple port memory. In one embodiment, the capacitive isolation feature is accomplished through use of neutral conductive elements disposed between adjacent bit lines. In another embodiment, the neutral conductive elements are omitted, but spacing between adjacent bit lines is substantially increased from minimum design rules, thereby decreasing capacitive coupling. The increased spacing is made possible by virtue of the reduced number of bit-lines required in the present invention shared bit-line technology. Because of the mirrored design approach, each bit-cell in the memory array has all of its associated bit-lines routed over the cell area. In the case of a two-port SRAM array, and without the shared approach of the present invention, there would necessarily be four bit-lines over each cell. Given the basic design requirement of keeping all layers tightly placed and routed, and without wasted area, this forces the designer of prior art arrays to route the bit-lines parallel and adjacent to one another. This approach increases the aforementioned coupling and noise problems between simultaneously accessed bit-lines. The only other alternative is to add an additional metal layer, which increases cost and complexity of the design, and is still less effective at reducing coupling and noise problems. With the advantageous utilization of the teachings of the present invention, the bit-lines are shared between adjacent columns, so the number of bit-lines is reduced by the inverse of the fractional distribution of the word-lines. In the illustrative embodiment, two ports, and two fractions, and hence one-half the number of bit-lines required.

On either side of the line of reflection 416 are routed the port 'A' bit-compliment 468 and bit-true 470 bit-lines. The lines are isolated by routing segments of the word-lines, which include metallic traces 480, 482, 484, and 486. These traces act as neutral conductive elements that isolate the two bit-lines 468 and 470. The even column 418 also has one of the port 'B' bit-lines, the bit-compliment bit-line 464 routed over it. This line 464 is isolated from the port 'A' bit compliment bit-line 468 by a ground conductor 466, which serves as the isolating neutral conductive element. The odd column 420 similarly has the other port 'B' bit-lines, the bit-true bit-line 474 routed over it. This line 474 is isolated from the port 'A' bit-true bit-line 470 by a ground conductor 472, which serves as the isolating neutral conductive element. As the data-slice repeats, the port 'B' lines from adjacent data slices are positioned near each other, but are isolated along a substantial portion of their respective lengths by the word-line routing traces 478, 481, 476, and 490. Thus, a significant advantage of the teaching of the present invention is realized through advantageous use of area on the upper metal layer, and reduced numbers of bit-lines made possible by bit-line sharing, so that the simultaneously accessed bit-lines are capacitively decoupled with neutral conductive elements, thereby reducing noise coupling and increasing performance of the memory array. Had the bit-line sharing not been utilized, then the available area would not allow room for the routing of neutral conductive elements.

Figure 18:
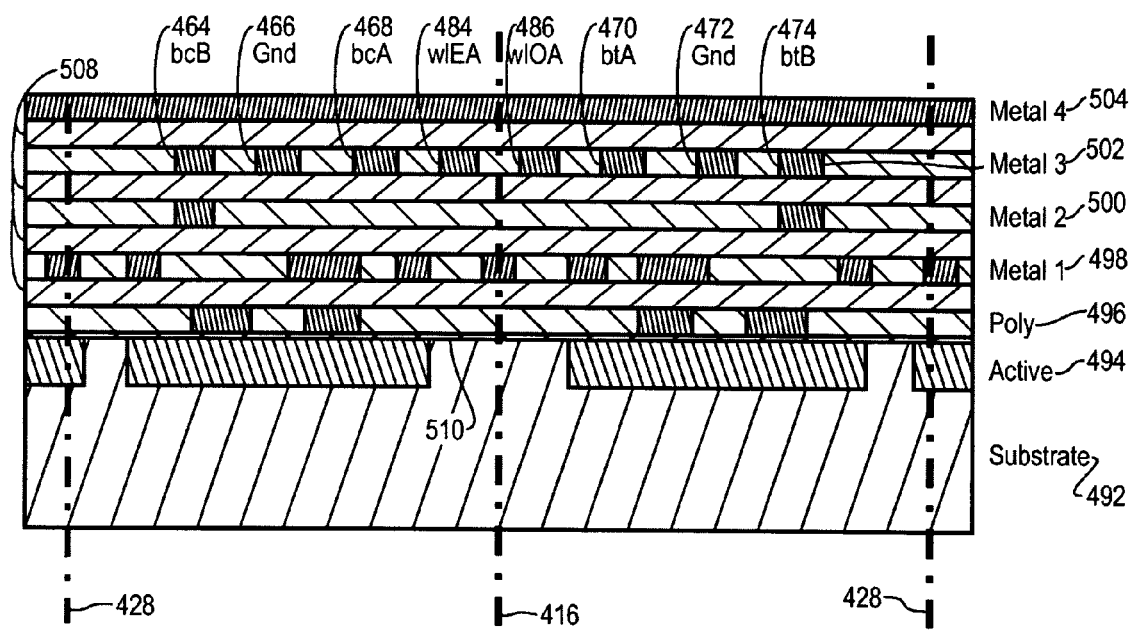
FIG. 18 is a section view drawing of a two-by-two memory cell data-slice in an illustrative embodiment of the present invention.

Reference is directed to FIG. 18, which is a section view drawing of the two-by-two memory cell data-slice in an illustrative embodiment of the present invention. The section labeled 'A—A' is taken along section line 442 in FIGS. 14 through 17. The line of reflection 416 and bit-cell boundaries 428 are illustrated with broken lines for reference. The substrate 492 has the active layer 494 diffused into it. The thin oxide layer 510 is disposed on top of the active layer, and the poly-R layer 496 is disposed on top of the thin oxide layer 510. The insulated junction between the poly layer 496 and the active layer 492 forms the FET gate junctions. The poly layer 496 and the upper metal layers 498, 500, 502, and 504 are insulted from one another by plural insulating layers 508. Those skilled in the art are familiar with memory array layer build-up techniques. The insulting layers 508 and thin oxide layer 510 have contact masks and via mask layouts formed therein that enable conductive links between the various layers. The Metal-1 layer 498 is the primary interface to the active 494 and poly 496 layers. The Metal-2 layer 500 is used for various interconnections as well as the routing of supply power to the active devices in the array. The Metal 4 layer 504 is used to route the word-lines. The Metal-3 layer routes the bit-lines, the ground conductors, and certain routing traces that serve as neutral conductive elements according to the teachings of the present invention.

The advantageous arrangement of the bit-lines and neutral conductive elements is apparent in the Metal-3 layer in FIG. 18. Routing sections of the word-lines 484, 486 are positioned about the line of reflection 416. On either side of the word-lines are the port 'A' bit-compliment line 468 and the port 'A' bit-true line 470. The ground lines 466, 472 fan-out from there, and the isolate the port 'B' bit-compliment line 464 and port 'B' bit-true line 474, respectively. Thus, the bit-lines are isolated by virtue of the teachings of the present invention.

Another aspect of memory array design is the implementation of array interface circuitry at the ends of the rows and columns in the array. The circuitry involved includes the read and write select addressing, the pre-charge circuitry, sense amplifiers, and other addressing circuitry. An efficient array design contemplates optimized layout of these components as well as the array circuitry itself. The teachings of the present invention reach into the interface circuitry and enable designers to optimize this portion of a memory design.

Figure 19:
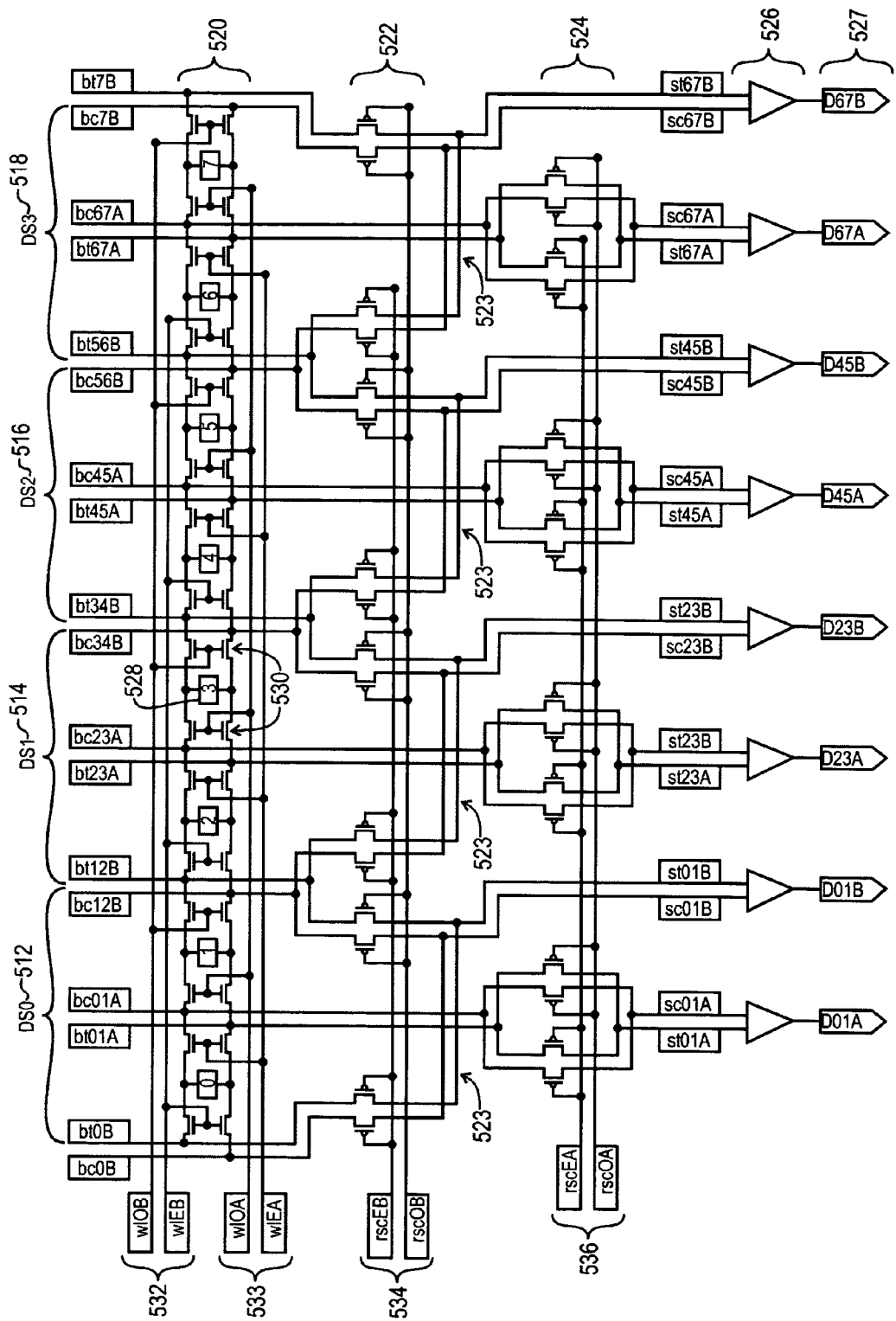
FIG. 19 is a schematic diagram showing the bit line select read path with full decode in an illustrative embodiment of the present invention.

Reference is directed to FIG. 19, which is a schematic diagram showing the bit-line select read path with full decode in an illustrative embodiment of the present invention. A fraction of a single row 520 of the array is illustrated, which includes several data slices. These include data slice 'DS0' 512, 'DS1' 514, 'DS2' 516, and 'DS3' 518. The row 520 is selected with either the port 'B' odd and even word-lines 532 or the port 'A' odd and even word-lines 533. Each bit-cell 528 is coupled to the array with pass gate pairs 530 that couple to the 'A' and 'B' ports. The array layout follows the teaching set forth hereinabove. Along the center of each data slice are the paired bit-lines for the 'A' port, which are the bit-true and bit-compliment lines designated as 'bt01A'/'bc01A', 'bt23A'/'bc23A', 'bt45A'/'bc45A', 'bt67A'/'bc67A', where the numeric portion of the designation indicates which of the columns share the particular bit-lines. The terms "true" and "compliment" in each line designation indicates the active state of the line; e.g. "t" or "true" means that the line is active in the logical high state. This convention is used throughout. Since the data slices are reflected about the port 'A' bit-lines, as discussed hereinbefore, the routing these bit-lines out of the arrays is straightforward. Each of these port 'A' bit-line pairs couple to a pair of read select compliment gates in a row 524 that are driven by the read select compliment lines for the even and odd ports 536. These are designated as 'rscEA' and rscOA'. The port 'B' bit-lines are routed at the boundary between data slices, and this is more problematic from a layout point of view since the layouts cannot be simply "mirrored". The port 'B' bit-lines are designated as 'bcOB'/'btOB', 'bc12B'/'bt12B', 'bc34B'/'bt34B', 'bc56B'/'bt56B', and 'bc7B'/.bt7B'. Each of these pairs is routed off of the array and are coupled to pairs of read select compliment even and odd lines through pairs of pass gates along row 522. Note that the pairing of these gates must cross the data-slice boundary using routing traces 523. Thus, the read select compliment port 'B lines, even and odd, 534 couple to the paired gates along row 522, with the pairing conductors 523 crossing the data slice boundaries. This unique approach enables the tight layout and sharing of bit-lines in multiple port memories not contemplated in the prior art. The output of the gated bit-line pairs are designated as sense true and sense compliment pairs and are coupled to a row of sense amplifiers 526, which output the data read from the array along row 527. The numeric convention of these lines will be obvious to those skilled in the art.

Figure 20:
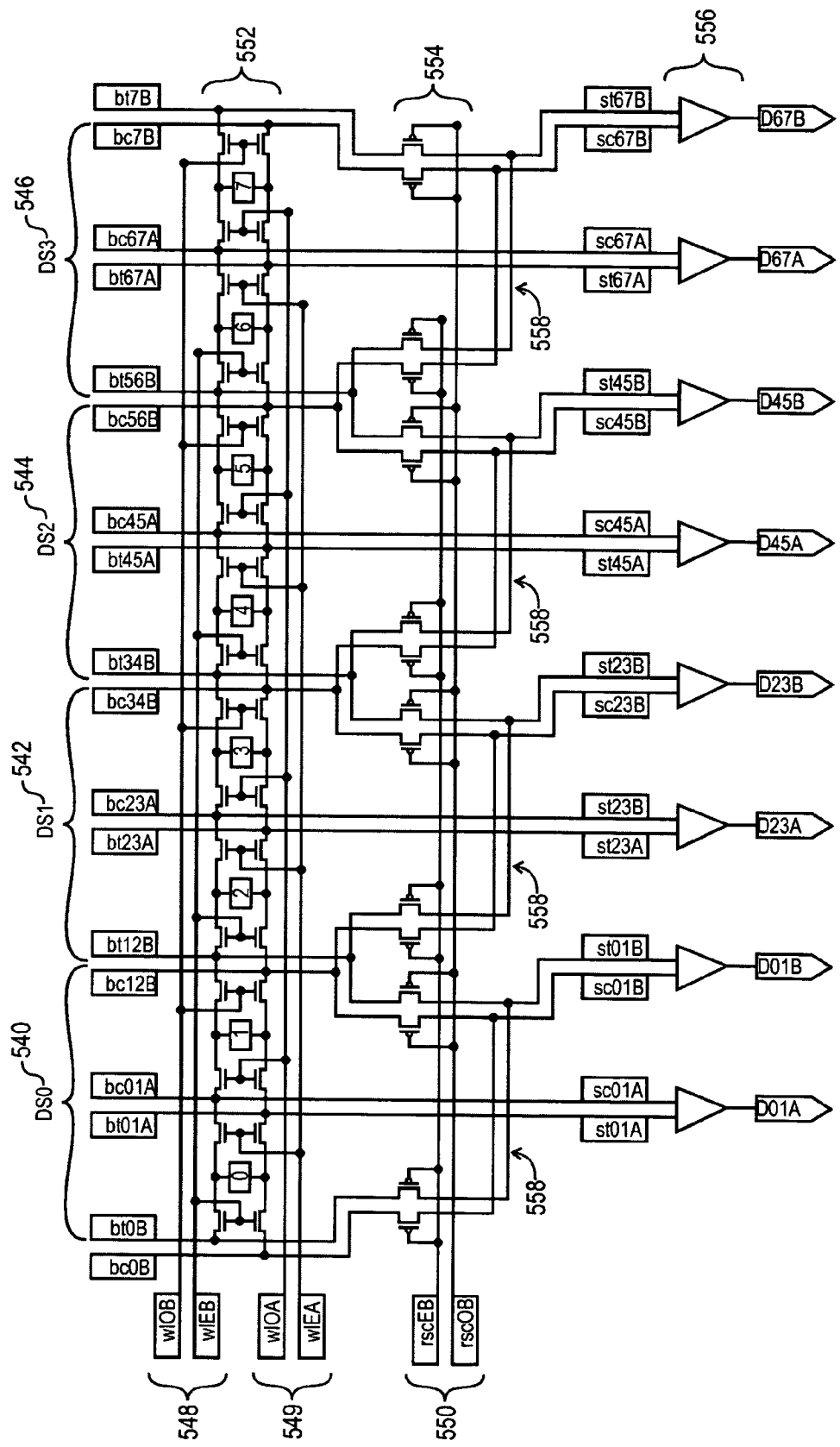
FIG. 20 is a schematic diagram showing the bit line select read path with partial decode in an illustrative embodiment of the present invention.

With respect to FIG. 19, it was noted that the bit-line pairs that lie along the center of each data slice employ a straightforward routing off the end of the array. FIG. 20 illustrates another simplification of the array interface design made possible through utilization of the teachings of the present invention. FIG. 20 is a schematic diagram showing the bit-line select read path with partial decode in an illustrative embodiment of the present invention. A single row 552 in the array is illustrated with eight bit-cell columns arranged into four data-slices 'DS0' 540, 'DS1' 542, 'DS2' 544, and 'DS3' 546. The row is accessed with the port 'B' word-line pair 548 and the port 'A' word-line pair 549. The addressing of the shared bit-lines between data-slices is accomplished using a row of paired gates 554 controlled by the read select compliment odd and even select lines ('rscEB' and 'rscOB') for the 'B' port 550. Since these pairing cross the data-slice boundaries, the cross-over conductors 558 are employed to pair the gates. Now, with respect to the port 'A' bit-line pairs that fall in the center of each data-slice, the read select compliment gate pairs are eliminated, which reduces the number of active components required to implement the array interface. Since the selection of the 'A' port and 'B' port, as well as the odd and even columns, is fully decoded in the word-line activations, the data line selection, or enablement, simply follows the word-line addressing, eliminating the need for read line select gating and control for the port 'A' bit lines. These lines are merely re-designated as the sense true and sense compliment lines that drive the row of sense amplifiers 556.

FIG. 19 and FIG. 20 illustrate advantages of the present invention regarding the read select array interface. Those skilled in the art will appreciate that the present invention provides similar advancements in the art regarding the write select array interface. Reference is directed FIG. 21, which is a schematic diagram showing the bit-line select write path with full decode in an illustrative embodiment of the present invention. A fraction of a single row 574 of the array is illustrated, which includes several data-slices. These include data-slice 'DS0' 560, 'DS1' 562, 'DS2' 564, and 'DS3' 566. The row 574 is selected with either the port 'B' odd and even word-lines 568 or the port 'A' odd and even word-lines 569. Along the center of each data-slice are the paired bit-lines for the 'A' port, which are the bit-true and bit-compliment lines designated as 'bt01A'/'bc01A', 'bt23A'/'bc23A', 'bt45A'/'bc45A', 'bt67A'/'bc67A', where the numeric portion of the designation indicates which of the columns share the particular bit-lines. Since the data-slice are reflected about these bit-lines, as discussed hereinbefore, the routing of these bit-lines out of the arrays is straightforward. Each of these port 'A' bit-line pairs couples to a pair of write select true gates in a row 578 that are driven by the write select true lines for the even and odd ports 572. These are designated as 'wstEA' and wstOA'. The port 'B' bit-lines are routed at the boundary between data-slices, and this is more problematic from a layout point of view since the layouts cannot be simply "mirrored". The port 'B' bit-lines are designated as 'bc0B'/'bt0B', 'bc12B'/'bt12B', 'bc34B'/'bt34B', 'bc56B'/'bt56B', and 'bc7B'/'bt7B'. Each of these pairs are routed off of the array and are coupled to pairs of write select true even and odd lines through pairs of pass gates along row 576. Note that the pairing of these gates must cross the data-slice boundary using routing traces 580. Thus, the write select true port 'B lines, even and odd, 570 couple to the paired gates along row 576, with the pairing conductors 580 crossing the data-slice boundaries. This unique approach enables the tight layout and sharing of bit-lines in multiple port memories not contemplated in the prior art. The input to the gated bit-line pairs are designated as input true ("it") and input compliment ("ic") pairs and are coupled to the aforementioned paired gates.

Figure 21:
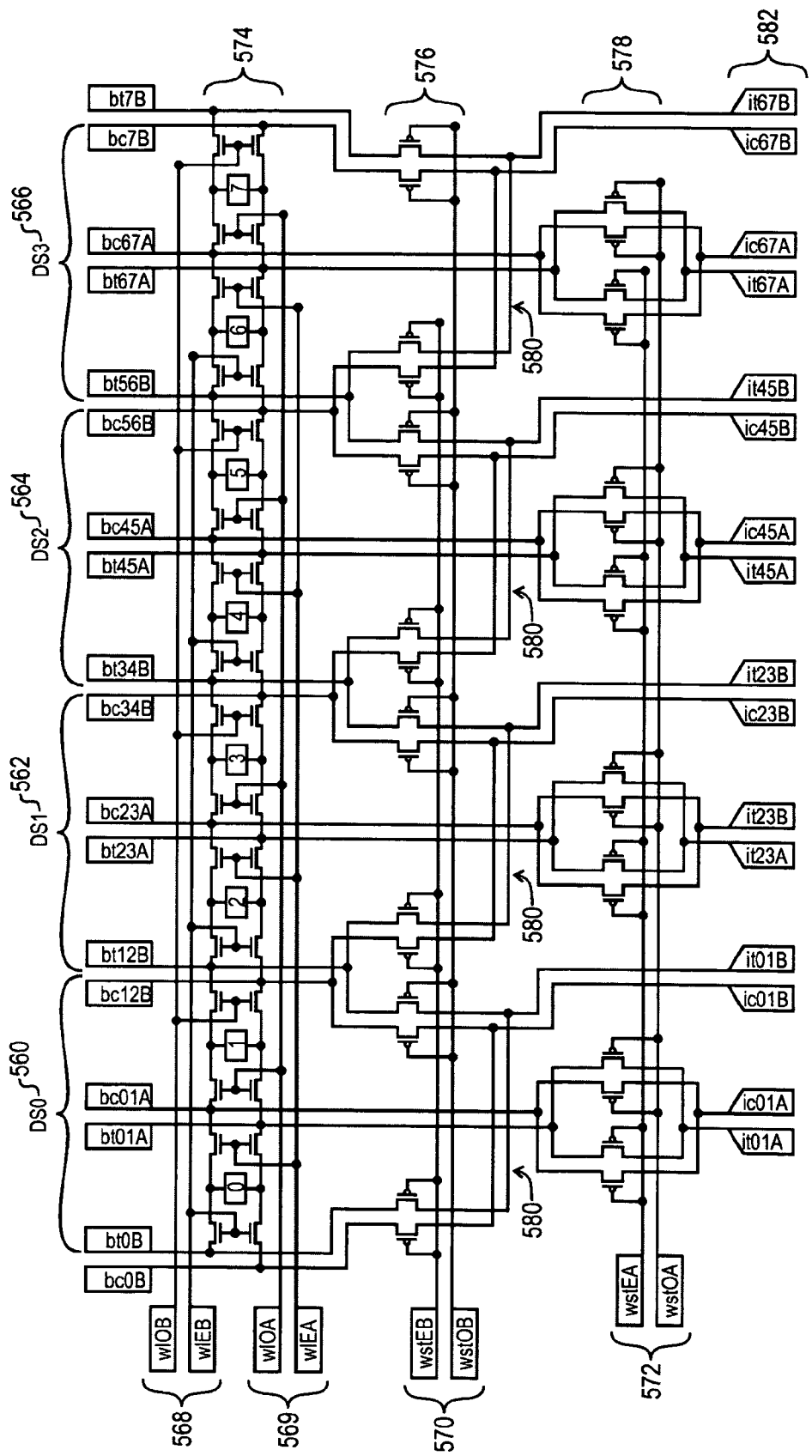
FIG. 21 is a schematic diagram showing the bit line select write path with full decode in an illustrative embodiment of the present invention.
Figure 22:
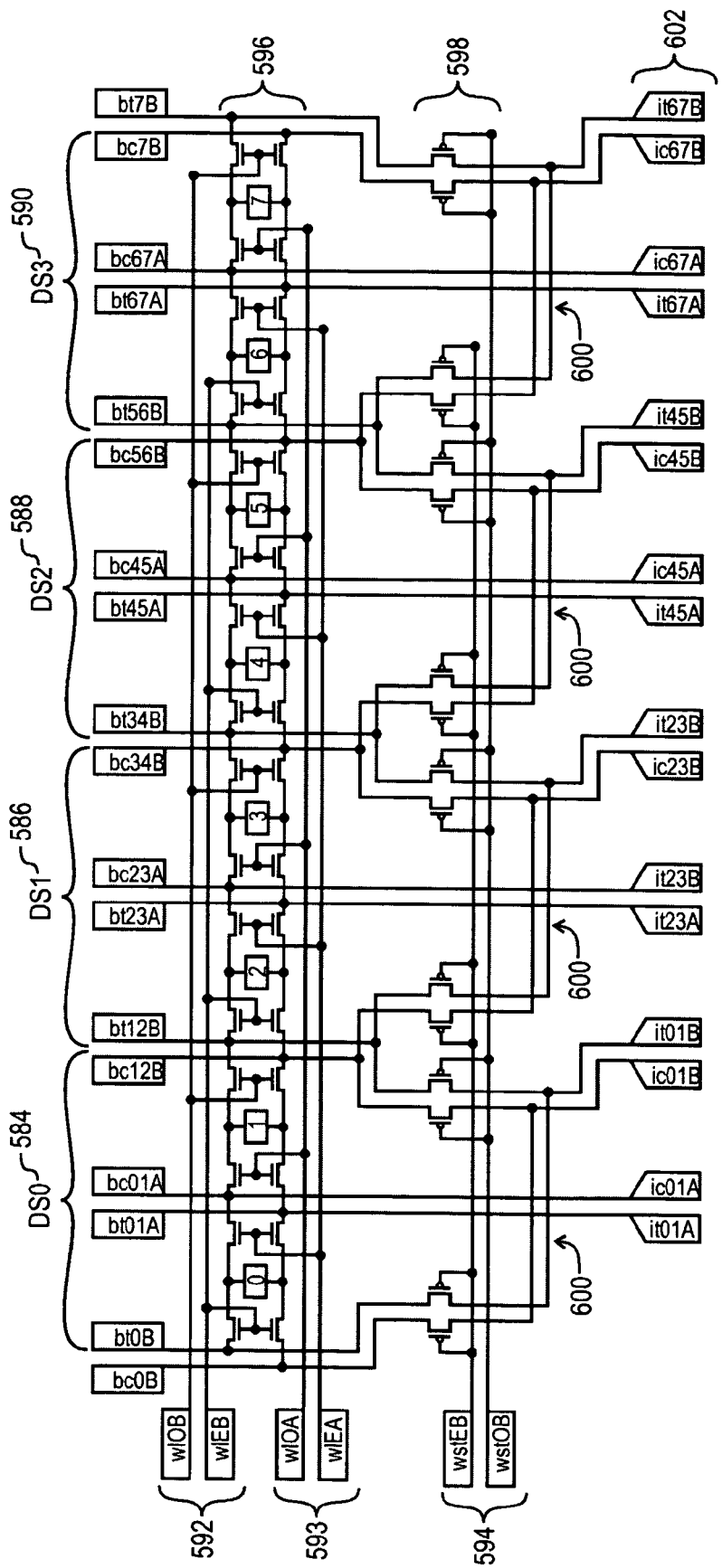
FIG. 22 is a is a schematic diagram showing the bit line select write path with partial decode in an illustrative embodiment of the present invention.

With respect to FIG. 21, it was noted that the bit-line pairs that lie along the center of each data slice employ a straightforward routing off the end of the array. FIG. 22 illustrates another simplification of the array interface design made possible through utilization of the teachings of the present invention. FIG. 22 is a schematic diagram showing the bit-line write select path with partial decode in an illustrative embodiment of the present invention. A single row 596 in the array is illustrated with eight bit-cell columns arranged into four data-slices 'DS0' 584, 'DS1' 586, 'DS2' 588, and 'DS3' 590. The row is accessed with the port 'B' word-line pair 592 and the port 'A' word-line pair 593. The addressing of the shared bit-lines between data-slices is accomplished using a row of paired gates 598 controlled by the write select true odd and even select lines ('wstEB' and 'wstOB') for the 'B' port 594. Since these pairing cross the data slice boundaries, the cross-over conductors 600 are employed to pair the gates. Now, with respect to the port 'A' bit-line pairs that fall in the center of each data-slice, the write select true gate pairs are eliminated, which reduces the number of active components required to implement the array interface. Since the selection of the 'A' port and 'B' port, as well as the odd and even columns, is fully decoded in the word-line activations, the data line selection, or enablement, simply follows the word-line addressing, eliminating the need for write line select gating and control for the port 'A' bit-lines. These lines are merely re-designated as the input true ("it") and input compliment ("ic") lines along row 602.

Figure 23:
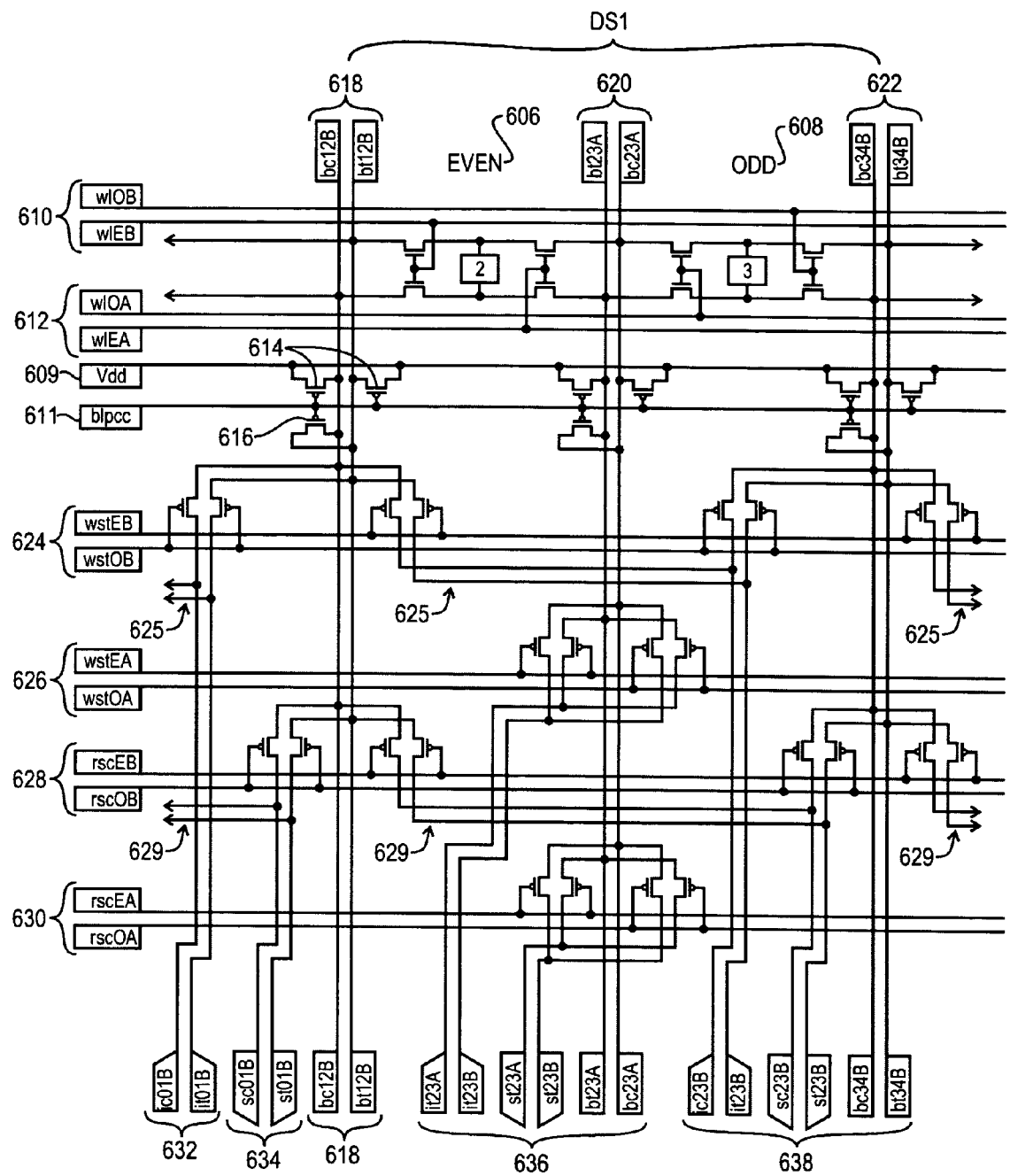
FIG. 23 is a is a schematic diagram showing the column read, write and pre-charge circuitry of a single data slice in an illustrative embodiment of the present invention.

A more complete schematic diagram for the bit-line array interface in an illustrative embodiment of the present invention is presented in FIG. 23. The array of bit-cells is represented by a single row of a single data-slice comprised of an even column 606 and an odd column 608. The row is addressed by the port 'B' even and odd word-lines 610 or the port 'A' even and odd word-lines 612. The bit-cells are numbered "2" and "3". The port 'A' bit-true and bit-compliment bit-lines 620 are aligned along the center of the data-slice and are shared by both columns. The port 'B' bit-lines are aligned along both side of the data-slice 618 and 622, and are shared with the columns adjacent to either side of the illustrated data slice (not shown). Each pair of bit-lines 618, 620, 622 are pre-charged to the supply voltage "Vdd" 609 through activation of the bit-line pre-charge compliment signal ("blpcc") 611. Activation of this line turns on a pair of FET's 614 that couple the bit-lines to the supply source 609. In addition, another activation of the pre-charge line 611 is to turn on an equalizing FET 616 that forces the pair of bit-lines to a zero potential difference.

The port 'A' bit-lines 620 are further coupled to pairs of FET gates that are driven by the port 'A' write select true lines 626. They are also further coupled to pairs of FET gates driven by the port 'A' read select compliment lines 630. As noted hereinbefore, the select lines and gates coupled to the port 'A' bit-lines can be eliminated. Respecting the port 'B' bit-lines 618, 622 the port 'B' write select true lines 624 are coupled through paired FET gates, as are the read select compliment lines 628. Note that the port 'B select lines are paired with crossover conductors 625 and 629 for the write select and read select line respectively. Finally, the left column is addressed by the bit-lines 618; the input true and compliment lines 633, and the sense true and compliment lines 634. This pattern is repeated for the center column 636, and the right column 638.

With respect to the illustrations in FIGS. 19 through 23, a dual port embodiment with dual write and dual read port capability is illustrated. However it is also useful to implement a memory with differing numbers of write access ports and read access ports. For example, a memory is contemplated that is configured with a single write access port, and with dual read access ports, as is taught herein. Each port is coupled with discrete pass gates, however bit-lines are shared in accordance with the teachings herein. Further embodiments are contemplated with a plurality of one or either of the write and read port configurations. The shared bit line technology taught herein is applied to reduce the number of array circuit traces and reduce the number of array interface circuit traces and active devices. Such application of the teachings of the present invention is suitable for both the write and read ports.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A memory, having N ports, comprising:
   an array of plural bit-cells organized as plural columns and plural rows;
   plural word-lines aligned with said plural rows, each of said plural word-lines electrically coupled to a discrete fraction of all of that portion of said plural bit-cells that lie along the corresponding one of said plural rows, and wherein each of said plural rows has N times the inverse of said fraction of said plural word-lines aligned therewith;
   plural bit-lines aligned with said plural columns, each of said plural bit-lines electrically coupled to all of that portion of said plural bit-cells that lie along at least a single corresponding one of said plural columns;
   wherein at least a first one of said plural bit-lines is electrically coupled to all of said plural bit-cells that lie along an integer multiple of N number of said plural columns, and coupled such that every one of said plural bit-cells, that lie along any given row of said plural bit-cells that are coupled to said first bit-line, is coupled to N unique ones of said plural word-lines, and
   plural conductive elements aligned in parallel with said plural bit-lines along a substantial portion of the length of said plural bit lines, said plural conductive elements interspersed with said plural bit lines such that no two of said plural bit lines that are simultaneously accessed during a memory read or write operation are adjacent to one another over a substantial portion of their respective lengths.

2. The memory of claim 1 wherein no two bit-cells within each of said discrete fractions of said plural bit-cells along any given row are positioned adjacent to one another.

3. The memory of claim 1 wherein said plural conductive elements include power supply or ground traces.

4. The memory of claim 1 wherein said plural conductive elements include word line traces.

5. The memory of claim 1 wherein said array of plural bit cells is organized into data slices that are N bits wide.

6. The memory of claim 5, further comprising:
   bit-line select logic circuitry coupled to said plural bit lines operable to enable read and write operations on said plural bit lines, and wherein
   address coupling conductive traces at the boundary of said data slices couple across the boundaries of said data slices.

7. The memory of claim 6 wherein the layout of bits cells in said data slices comprise mirror-image layouts that are reflected about a line on the edge of a bit cell.

8. The memory of claim 7 wherein the output of said bit-line select logic circuitry is hard wired to a fraction of said plural bit lines, which are located adjacent to said line about which layouts are mirror imaged.

9. The memory of claim 1 wherein the multiple port memory is a register file.

10. The memory of claim 1, further comprising:
    plural memory array port interface circuits coupled to said plural bit-lines in a manner corresponding to said integer multiple of N number of said plural columns.

11. The memory of claim 10 wherein said plural memory array port interface circuits comprise write access port circuits and read access port circuits.

12. The memory of claim 11 wherein the number of write access port circuits and the number of read access port circuits are different.

13. The memory of claim 1 wherein N equals one.

14. A method of accessing an N-port memory having an array of plural bit-cells organized as plural columns and plural rows, with plural word-lines aligned with the plural rows, each of the plural word-lines electrically coupled to a discrete fraction of all of the plural bit-cells that lie along its corresponding row, wherein each of the plural rows has N times the inverse of the fraction of the plural word lines aligned therewith, and with plural bit-lines aligned with the plural columns, each of the bit-lines being electrically coupled to all of the bit-cells that lie along at least a single corresponding column, and wherein at least a first one of the plural bit-lines is electrically coupled to all of the bit-cells that lie along an integer multiple of N number of the plural columns, and coupled such that every one of the plural bit-cells, that lie along any given row of bit-cells that are coupled to the first bit-line, are coupled to N unique ones of the plural word-lines, and the memory having plural conductive elements aligned in parallel with the plural bit-lines along a substantial portion of the length of the plural bit lines, the plural conductive elements interspersed with the plural bit lines such that no two of the plural bit lines that are simultaneously accessed during a memory read or write operation are adjacent to one another over a substantial portion of their respective lengths, the method comprising the steps of:
    asserting a first word-line coupled to a first bit cell that is also coupled to the first bit-line, thereby enabling said first bit-cell;
    accessing the first bit-line to read or write the data in said first bit-cell;
    asserting a second word-line coupled to a second bit-cell that is also coupled to the first bit-line, thereby enabling said second bit-cell, and
    accessing the first bit-line to read or write the data in said second bit-cell.

15. The method of claim 14 wherein the plural conductive elements include power supply traces, ground traces or word line traces.

16. The method of claim 10 wherein the array of plural bit cells is organized into N bit wide data slices.

17. The method of claim 16 wherein the memory further includes bit-line select logic circuitry coupled to the plural bit lines for enabling read and write operations on the plural bit lines, and wherein address coupling conductive traces at the boundary of the data slices couple across the boundaries of the data slices.

18. The method of claim 17 wherein the layout of bits cells in the data slices are mirror-image layouts that are reflected about a line on the edge of a bit cell.

19. The method of claim 17 wherein the output of the bit-line select logic circuitry is hard wired to portions of the plural bit lines that a located adjacent to the line about which layouts are mirror imaged.

20. A memory, having N ports, comprising:
    an array of plural bit-cells organized as plural columns and plural rows;
    plural word-lines aligned with said plural rows, each of said plural word-lines electrically coupled to a discrete fraction of all of that portion of said plural bit-cells that lie along the corresponding one of said plural rows, and wherein each of said plural rows has N times the inverse of said fraction of said plural word-lines aligned therewith;
    plural bit-lines aligned with said plural columns, each of said plural bit-lines electrically coupled to all of that portion of said plural bit-cells that lie along at least a single corresponding one of said plural columns;

wherein at least a first one of said plural bit-lines is electrically coupled to all of said plural bit-cells that lie along an integer multiple of N number of said plural columns, and coupled such that every one of said plural bit-cells, that lie along any given row of said plural bit-cells that are coupled to said first bit-line, is coupled to N unique ones of said plural word-lines, and a first neutral conductive element aligned in parallel with said at least a first one of said plural bit-lines along a substantial portion of the length thereof, thereby providing capacitive isolation for said at least a first one of said plural bit-lines from another one of said plural bit lines.

* * * * *